(12) United States Patent
Im

(10) Patent No.: US 8,598,588 B2
(45) Date of Patent: Dec. 3, 2013

(54) SYSTEMS AND METHODS FOR PROCESSING A FILM, AND THIN FILMS

(75) Inventor: James S. Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 1006 days.

(21) Appl. No.: 12/095,450

(22) PCT Filed: Dec. 5, 2006

(86) PCT No.: PCT/US2006/046405
§ 371 (c)(1),
(2), (4) Date: Sep. 16, 2008

(87) PCT Pub. No.: WO2007/067541
PCT Pub. Date: Jun. 14, 2007

(65) Prior Publication Data
US 2009/0001523 A1 Jan. 1, 2009

Related U.S. Application Data

(60) Provisional application No. 60/742,276, filed on Dec. 5, 2005.

(51) Int. Cl.
*H01L 29/10* (2006.01)

(52) U.S. Cl.
USPC ............. 257/66; 438/149; 438/151; 438/157; 438/166

(58) Field of Classification Search
USPC ...................... 257/66; 438/149, 151, 157, 166
See application file for complete search history.

(56) References Cited

U.S. PATENT DOCUMENTS

| | | |
|---|---|---|
| 3,632,205 A | 1/1972 | Marcy et al. |
| 4,234,358 A | 11/1980 | Celler et al. |

(Continued)

FOREIGN PATENT DOCUMENTS

| | | |
|---|---|---|
| CN | 1495848 A | 5/2004 |
| CN | 101111925 A | 1/2008 |

(Continued)

OTHER PUBLICATIONS

Bergmann, R. et al., Nucleation and Growth of Crystalline Silicon Films on Glass for Solar Cells, Phys. Stat. Sol., 1998, pp. 587-602, vol. 166, Germany.

(Continued)

*Primary Examiner* — Fernando L Toledo
*Assistant Examiner* — Mohammed Shamsuzzaman
(74) *Attorney, Agent, or Firm* — Wilmer Cutler Pickering Hale and Dorr LLP

(57) ABSTRACT

In some embodiments, a method of processing a film is provided, the method comprising defining a plurality of spaced-apart regions to be pre-crystallized within the film, the film being disposed on a substrate and capable of laser-induced melting; generating a laser beam having a fluence that is selected to form a mixture of solid and liquid in the film and where a fraction of the film is molten throughout its thickness in an irradiated region; positioning the film relative to the laser beam in preparation for at least partially pre-crystallizing a first region of said plurality of spaced-apart regions; directing the laser beam onto a moving at least partially reflective optical element in the path of the laser beam, the moving optical element redirecting the beam so as to scan a first portion of the first region with the beam in a first direction at a first velocity, wherein the first velocity is selected such that the beam irradiates and forms the mixture of solid and liquid in the first portion of the first region, wherein said first portion of the first region upon cooling forms crystalline grains having predominantly the same crystallographic orientation in at least a single direction; and crystallizing at least the first portion of the first region using laser-induced melting.

17 Claims, 9 Drawing Sheets

(56) References Cited

U.S. PATENT DOCUMENTS

| | | | |
|---|---|---|---|
| 4,309,225 A | 1/1982 | Fan et al. | |
| 4,382,658 A | 5/1983 | Shields et al. | |
| 4,456,371 A | 6/1984 | Lin | |
| 4,639,277 A | 1/1987 | Hawkins | |
| 4,691,983 A | 9/1987 | Kobayashi et al. | |
| 4,727,047 A | 2/1988 | Bozler et al. | |
| 4,758,533 A | 7/1988 | Magee et al. | |
| 4,793,694 A | 12/1988 | Liu | |
| 4,800,179 A | 1/1989 | Mukai et al. | |
| 4,855,014 A | 8/1989 | Kakimoto et al. | |
| 4,870,031 A | 9/1989 | Sugahara et al. | |
| 4,940,505 A * | 7/1990 | Schachameyer et al. | 117/97 |
| 4,970,546 A | 11/1990 | Suzuki et al. | |
| 4,977,104 A | 12/1990 | Sawada et al. | |
| 5,032,233 A | 7/1991 | Yu et al. | |
| 5,061,655 A | 10/1991 | Ipposhi et al. | |
| 5,076,667 A | 12/1991 | Stewart | |
| RE33,836 E | 3/1992 | Resor, III et al. | |
| 5,145,808 A | 9/1992 | Sameshima et al. | |
| 5,173,441 A | 12/1992 | Yu et al. | |
| 5,204,659 A | 4/1993 | Sarma | |
| 5,233,207 A | 8/1993 | Anzai et al. | |
| 5,247,375 A | 9/1993 | Mochizuki | |
| 5,281,840 A | 1/1994 | Sarma | |
| 5,285,236 A | 2/1994 | Jain | |
| 5,291,240 A | 3/1994 | Jain | |
| 5,294,811 A | 3/1994 | Aoyama | |
| 5,304,357 A | 4/1994 | Sato et al. | |
| 5,338,959 A | 8/1994 | Kim et al. | |
| 5,373,803 A | 12/1994 | Noguchi et al. | |
| 5,395,481 A | 3/1995 | McCarthy | |
| 5,409,867 A | 4/1995 | Asano et al. | |
| 5,453,594 A | 9/1995 | Konecny | |
| 5,456,763 A | 10/1995 | Kaschmitter et al. | |
| 5,496,768 A | 3/1996 | Kudo et al. | |
| 5,512,494 A | 4/1996 | Tanabe et al. | |
| 5,523,193 A | 6/1996 | Nelson | |
| 5,529,951 A * | 6/1996 | Noguchi et al. | 438/487 |
| 5,571,430 A * | 11/1996 | Kawasaki et al. | 219/121.78 |
| 5,591,668 A | 1/1997 | Maegawa et al. | |
| 5,663,579 A | 9/1997 | Noguchi | |
| 5,683,935 A | 11/1997 | Miyamoto | |
| 5,710,050 A | 1/1998 | Makita et al. | |
| 5,721,606 A | 2/1998 | Jain | |
| 5,742,426 A * | 4/1998 | York | 359/298 |
| 5,756,364 A * | 5/1998 | Tanaka et al. | 438/30 |
| 5,766,989 A * | 6/1998 | Maegawa et al. | 438/166 |
| 5,767,003 A * | 6/1998 | Noguchi | 438/487 |
| 5,817,548 A | 10/1998 | Noguchi et al. | |
| 5,844,588 A | 12/1998 | Anderson | |
| 5,846,625 A * | 12/1998 | Terao et al. | 428/64.1 |
| 5,858,807 A | 1/1999 | Kawamura | |
| 5,861,991 A | 1/1999 | Fork | |
| 5,893,990 A | 4/1999 | Tanaka et al. | |
| 5,948,291 A | 9/1999 | Neylan et al. | |
| 5,960,323 A | 9/1999 | Wakita et al. | |
| 5,986,807 A | 11/1999 | Fork | |
| 6,002,523 A | 12/1999 | Tanaka | |
| 6,014,944 A | 1/2000 | Aklufi et al. | |
| 6,020,224 A | 2/2000 | Shimogaichi et al. | |
| 6,020,244 A | 2/2000 | Thompson et al. | |
| 6,045,980 A * | 4/2000 | Edelkind et al. | 430/320 |
| 6,072,631 A | 6/2000 | Guenther et al. | |
| 6,081,381 A | 6/2000 | Shalapenok et al. | |
| 6,117,752 A * | 9/2000 | Suzuki | 438/487 |
| 6,120,976 A | 9/2000 | Treadwell et al. | |
| 6,130,009 A | 10/2000 | Smith et al. | |
| 6,130,455 A | 10/2000 | Yoshinouchi et al. | |
| 6,136,632 A | 10/2000 | Higashi | |
| 6,156,997 A | 12/2000 | Yamazaki et al. | |
| 6,162,711 A | 12/2000 | Ma et al. | |
| 6,169,014 B1 | 1/2001 | McCulloch et al. | |
| 6,172,820 B1 | 1/2001 | Kuwahara et al. | |
| 6,176,922 B1 | 1/2001 | Aklufi et al. | |
| 6,177,301 B1 | 1/2001 | Jung et al. | |
| 6,184,490 B1 | 2/2001 | Schweizer | |
| 6,187,088 B1 | 2/2001 | Okumura et al. | |
| 6,190,985 B1 | 2/2001 | Buynoski | |
| 6,193,796 B1 | 2/2001 | Yang et al. | |
| 6,203,952 B1 | 3/2001 | O'Brien et al. | |
| 6,235,614 B1 | 5/2001 | Yang et al. | |
| 6,242,291 B1 | 6/2001 | Kusumoto et al. | |
| 6,274,488 B1 | 8/2001 | Talwar et al. | |
| 6,285,001 B1 | 9/2001 | Fleming et al. | |
| 6,300,175 B1 | 10/2001 | Moon et al. | |
| 6,313,435 B1 | 11/2001 | Shoemaker et al. | |
| 6,316,338 B1 | 11/2001 | Jung et al. | |
| 6,320,227 B1 | 11/2001 | Lee et al. | |
| 6,322,625 B2 | 11/2001 | Im | |
| 6,326,186 B1 | 12/2001 | Kirk et al. | |
| 6,326,215 B1 | 12/2001 | Keen | |
| 6,326,286 B1 | 12/2001 | Park et al. | |
| 6,333,232 B1 | 12/2001 | Kunikiyo et al. | |
| 6,341,042 B1 | 1/2002 | Matsunaka et al. | |
| 6,348,990 B1 | 2/2002 | Igasaki et al. | |
| 6,353,218 B1 | 3/2002 | Yamazaki et al. | |
| 6,358,784 B1 | 3/2002 | Zhang et al. | |
| 6,368,945 B1 | 4/2002 | Im | |
| 6,388,146 B1 | 5/2002 | Onishi et al. | |
| 6,388,386 B1 | 5/2002 | Kunii et al. | |
| 6,392,810 B1 | 5/2002 | Tanaka et al. | |
| 6,393,042 B1 | 5/2002 | Tanaka et al. | |
| 6,407,012 B1 | 6/2002 | Miyasaka et al. | |
| 6,410,373 B1 | 6/2002 | Chang et al. | |
| 6,429,100 B2 | 8/2002 | Yoneda et al. | |
| 6,432,758 B1 | 8/2002 | Cheng et al. | |
| 6,437,284 B1 | 8/2002 | Okamoto et al. | |
| 6,444,506 B1 | 9/2002 | Kusumoto et al. | |
| 6,445,359 B1 | 9/2002 | Ho | |
| 6,448,612 B1 | 9/2002 | Miyazaki et al. | |
| 6,451,631 B1 | 9/2002 | Grigoropoulos et al. | |
| 6,455,359 B1 * | 9/2002 | Yamazaki et al. | 438/166 |
| 6,468,845 B1 | 10/2002 | Nakajima et al. | |
| 6,471,772 B1 | 10/2002 | Tanaka et al. | |
| 6,472,684 B1 | 10/2002 | Yamazaki et al. | |
| 6,476,447 B1 | 11/2002 | Yamazaki et al. | |
| 6,479,837 B1 | 11/2002 | Ogawa et al. | |
| 6,482,722 B2 * | 11/2002 | Kunii et al. | 438/487 |
| 6,493,042 B1 | 12/2002 | Bozdagi et al. | |
| 6,495,067 B1 | 12/2002 | Ono et al. | |
| 6,495,405 B2 | 12/2002 | Voutsas et al. | |
| 6,501,095 B2 | 12/2002 | Yamaguchi et al. | |
| 6,504,175 B1 | 1/2003 | Mei et al. | |
| 6,506,636 B2 | 1/2003 | Yamazaki et al. | |
| 6,511,718 B1 | 1/2003 | Paz de Araujo et al. | |
| 6,512,634 B2 | 1/2003 | Tanaka et al. | |
| 6,516,009 B1 * | 2/2003 | Tanaka | 372/24 |
| 6,521,492 B2 | 2/2003 | Miyasaka et al. | |
| 6,526,585 B1 | 3/2003 | Hill | |
| 6,528,359 B2 | 3/2003 | Kusumoto et al. | |
| 6,531,681 B1 | 3/2003 | Markle et al. | |
| 6,535,535 B1 | 3/2003 | Yamazaki et al. | |
| 6,555,422 B1 | 4/2003 | Yamazaki et al. | |
| 6,555,449 B1 | 4/2003 | Im et al. | |
| 6,563,077 B2 | 5/2003 | Im | |
| 6,573,163 B2 | 6/2003 | Voutsas et al. | |
| 6,573,531 B1 | 6/2003 | Im et al. | |
| 6,577,380 B1 * | 6/2003 | Sposili et al. | 355/67 |
| 6,582,827 B1 | 6/2003 | Im | |
| 6,590,228 B2 | 7/2003 | Voutsas et al. | |
| 6,608,326 B1 | 8/2003 | Shinagawa et al. | |
| 6,621,044 B2 | 9/2003 | Jain et al. | |
| 6,635,554 B1 | 10/2003 | Im et al. | |
| 6,635,932 B2 * | 10/2003 | Grigoropoulos et al. | 257/359 |
| 6,667,198 B2 | 12/2003 | Shimoto et al. | |
| 6,693,258 B2 | 2/2004 | Sugano et al. | |
| 6,734,635 B2 | 5/2004 | Kunii et al. | |
| 6,741,621 B2 | 5/2004 | Asano | |
| 6,750,424 B2 | 6/2004 | Tanaka | |
| 6,755,909 B2 | 6/2004 | Jung | |
| 6,784,455 B2 | 8/2004 | Maekawa et al. | |
| 6,830,993 B1 | 12/2004 | Im et al. | |
| 6,858,477 B2 | 2/2005 | Deane et al. | |
| 6,908,835 B2 | 6/2005 | Sposili et al. | |

(56) References Cited

U.S. PATENT DOCUMENTS

| | | |
|---|---|---|
| 6,916,690 B2 | 7/2005 | Chang |
| 6,961,117 B2 | 11/2005 | Im |
| 6,962,860 B2 | 11/2005 | Yamazaki et al. |
| 6,984,573 B2 | 1/2006 | Yamazaki et al. |
| 7,029,996 B2 | 4/2006 | Im et al. |
| 7,078,281 B2 | 7/2006 | Tanaka et al. |
| 7,078,793 B2 | 7/2006 | Ruckerbauer et al. |
| 7,091,411 B2 | 8/2006 | Falk et al. |
| 7,115,503 B2 | 10/2006 | Im |
| 7,119,365 B2 | 10/2006 | Takafuji et al. |
| 7,132,204 B2 | 11/2006 | Jung |
| 7,144,793 B2 | 12/2006 | Gosain et al. |
| 7,164,152 B2 | 1/2007 | Im |
| 7,183,229 B2 | 2/2007 | Yamanaka |
| 7,187,016 B2 | 3/2007 | Arima |
| 7,189,624 B2 | 3/2007 | Ito |
| 7,192,479 B2 | 3/2007 | Mitani et al. |
| 7,192,818 B1 | 3/2007 | Lee et al. |
| 7,199,397 B2 | 4/2007 | Huang et al. |
| 7,217,605 B2 | 5/2007 | Kawasaki et al. |
| 7,297,982 B2 | 11/2007 | Suzuki et al. |
| 7,311,778 B2 | 12/2007 | Im et al. |
| 7,318,866 B2 | 1/2008 | Im |
| 7,326,876 B2 | 2/2008 | Jung |
| 7,364,952 B2 | 4/2008 | Im |
| 7,399,359 B2 | 7/2008 | Im et al. |
| 7,645,337 B2 | 1/2010 | Im et al. |
| 7,700,462 B2 | 4/2010 | Tanaka et al. |
| 7,804,647 B2 | 9/2010 | Mitani et al. |
| 2001/0001745 A1 | 5/2001 | Im et al. |
| 2001/0029089 A1 | 10/2001 | Tanaka |
| 2001/0030292 A1 | 10/2001 | Brotherton |
| 2001/0041426 A1 | 11/2001 | Im |
| 2002/0031876 A1 | 3/2002 | Hara et al. |
| 2002/0083557 A1 | 7/2002 | Jung |
| 2002/0104750 A1 | 8/2002 | Ito |
| 2002/0119609 A1 | 8/2002 | Hatano et al. |
| 2002/0151115 A1 | 10/2002 | Nakajima et al. |
| 2002/0197778 A1 | 12/2002 | Kasahara et al. |
| 2003/0006221 A1 | 1/2003 | Hong et al. |
| 2003/0013278 A1 | 1/2003 | Jang et al. |
| 2003/0013280 A1 | 1/2003 | Yamanaka |
| 2003/0022471 A1 | 1/2003 | Taketomi et al. |
| 2003/0029212 A1 | 2/2003 | Im |
| 2003/0057418 A1 | 3/2003 | Asano |
| 2003/0060026 A1 | 3/2003 | Yamazaki et al. |
| 2003/0068836 A1 | 4/2003 | Hongo et al. |
| 2003/0088848 A1 | 5/2003 | Crowder |
| 2003/0096489 A1 | 5/2003 | Im et al. |
| 2003/0104682 A1* | 6/2003 | Hara et al. .............. 438/487 |
| 2003/0119286 A1 | 6/2003 | Im et al. |
| 2003/0148565 A1 | 8/2003 | Yamanaka |
| 2003/0148594 A1 | 8/2003 | Yamazaki et al. |
| 2003/0183270 A1 | 10/2003 | Falk et al. |
| 2003/0194613 A1 | 10/2003 | Voutsas et al. |
| 2003/0196589 A1 | 10/2003 | Mitani et al. |
| 2003/0218171 A1 | 11/2003 | Isobe et al. |
| 2004/0016967 A1 | 1/2004 | Yamazaki et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0209447 A1 | 10/2004 | Gosain et al. |
| 2004/0222187 A1 | 11/2004 | Lin |
| 2004/0224487 A1 | 11/2004 | Yang |
| 2005/0003591 A1 | 1/2005 | Takaoka et al. |
| 2005/0032249 A1 | 2/2005 | Im et al. |
| 2005/0034653 A1 | 2/2005 | Im et al. |
| 2005/0037552 A1 | 2/2005 | Yamazaki et al. |
| 2005/0059222 A1 | 3/2005 | You |
| 2005/0059224 A1 | 3/2005 | Im |
| 2005/0059265 A1 | 3/2005 | Im |
| 2005/0112906 A1 | 5/2005 | Maekawa et al. |
| 2005/0139830 A1 | 6/2005 | Takeda et al. |
| 2005/0141580 A1 | 6/2005 | Partlo et al. |
| 2005/0142450 A1 | 6/2005 | Jung |
| 2005/0142451 A1 | 6/2005 | You |
| 2005/0145845 A1* | 7/2005 | Jyumonji et al. ........... 257/66 |
| 2005/0169330 A1* | 8/2005 | Hongo et al. ........... 372/38.02 |
| 2005/0202654 A1 | 9/2005 | Im |
| 2005/0233491 A1* | 10/2005 | Hirai ..................... 438/48 |
| 2005/0235903 A1 | 10/2005 | Im et al. |
| 2005/0236908 A1 | 10/2005 | Rivin |
| 2005/0255640 A1* | 11/2005 | Im et al. .................. 438/166 |
| 2006/0030164 A1 | 2/2006 | Im |
| 2006/0035478 A1 | 2/2006 | You |
| 2006/0040512 A1 | 2/2006 | Im |
| 2006/0060130 A1 | 3/2006 | Im |
| 2006/0102901 A1* | 5/2006 | Im et al. .................. 257/64 |
| 2006/0125741 A1 | 6/2006 | Tanaka et al. |
| 2006/0134890 A1 | 6/2006 | Im |
| 2006/0211183 A1 | 9/2006 | Duan et al. |
| 2006/0254500 A1 | 11/2006 | Im et al. |
| 2007/0007242 A1 | 1/2007 | Im |
| 2007/0010074 A1 | 1/2007 | Im |
| 2007/0010104 A1 | 1/2007 | Im et al. |
| 2007/0012664 A1 | 1/2007 | Im |
| 2007/0020942 A1 | 1/2007 | Im |
| 2007/0032096 A1 | 2/2007 | Im |
| 2007/0051302 A1 | 3/2007 | Gosain et al. |
| 2007/0054477 A1 | 3/2007 | Kim et al. |
| 2007/0108472 A1 | 5/2007 | Jeong et al. |
| 2007/0111349 A1 | 5/2007 | Im |
| 2007/0145017 A1* | 6/2007 | Im et al. ................. 219/121.6 |
| 2007/0148834 A1* | 6/2007 | Tanaka et al. ........... 438/151 |
| 2007/0184638 A1 | 8/2007 | Kang et al. |
| 2007/0215877 A1 | 9/2007 | Kato et al. |
| 2007/0215942 A1 | 9/2007 | Chen et al. |
| 2007/0238270 A1* | 10/2007 | Kim et al. ................ 438/487 |
| 2008/0035863 A1 | 2/2008 | Im et al. |
| 2008/0124526 A1 | 5/2008 | Im |
| 2008/0176414 A1* | 7/2008 | Im ......................... 438/795 |
| 2009/0137105 A1* | 5/2009 | Im ......................... 438/487 |
| 2009/0242805 A1 | 10/2009 | Im |
| 2009/0309104 A1* | 12/2009 | Im et al. .................. 257/75 |
| 2010/0024865 A1 | 2/2010 | Shah et al. |
| 2011/0108108 A1* | 5/2011 | Im et al. .................. 136/258 |
| 2012/0045191 A1* | 2/2012 | Im ......................... 392/419 |

FOREIGN PATENT DOCUMENTS

| | | |
|---|---|---|
| DE | 19839 718 | 9/1998 |
| DE | 10103 670 | 1/2001 |
| EP | 655774 | 5/1995 |
| EP | 681316 | 11/1995 |
| EP | 1067593 | 1/2001 |
| GB | 2338342 | 12/1999 |
| GB | 2338343 | 12/1999 |
| GB | 2338597 | 12/1999 |
| JP | S57-027035 | 2/1982 |
| JP | 62160781 | 7/1987 |
| JP | 62181419 | 8/1987 |
| JP | 62216320 | 9/1987 |
| JP | H01-256114 | 10/1989 |
| JP | 2081422 | 3/1990 |
| JP | 2283036 | 11/1990 |
| JP | 04033327 | 2/1992 |
| JP | 04-279064 | 10/1992 |
| JP | 5041519 A | 2/1993 |
| JP | 5048190 | 2/1993 |
| JP | 06-011729 | 1/1994 |
| JP | 6252048 | 9/1994 |
| JP | H06-260502 | 9/1994 |
| JP | 6283422 | 10/1994 |
| JP | 7176757 | 7/1995 |
| JP | 08078330 | 3/1996 |
| JP | H09-007968 | 1/1997 |
| JP | 9171971 A | 6/1997 |
| JP | 11025064 A | 6/1997 |
| JP | H09-270393 | 9/1997 |
| JP | 9260681 A | 10/1997 |

(56) References Cited

FOREIGN PATENT DOCUMENTS

| | | |
|---|---|---|
| JP | 9321210 A | 12/1997 |
| JP | 10189998 | 7/1998 |
| JP | H10-244390 | 9/1998 |
| JP | 11064883 | 3/1999 |
| JP | 11-281997 | 10/1999 |
| JP | 11297852 | 10/1999 |
| JP | 11330000 A | 11/1999 |
| JP | 2000505241 A | 4/2000 |
| JP | 2000223425 | 8/2000 |
| JP | 2000-315652 | 11/2000 |
| JP | 2000346618 | 12/2000 |
| JP | 2001023920 | 1/2001 |
| JP | 2002-231628 | 8/2002 |
| JP | 2002-353142 | 12/2002 |
| JP | 2002353159 A | 12/2002 |
| JP | 2003-031496 | 1/2003 |
| JP | 2003-045820 | 2/2003 |
| JP | 2003-086505 | 3/2003 |
| JP | 2003-509844 | 3/2003 |
| JP | 20003100653 | 4/2003 |
| JP | 2003-338508 | 11/2003 |
| JP | 2004031809 | 1/2004 |
| JP | 2004-311935 | 11/2004 |
| JP | 2004-343091 | 12/2004 |
| JP | 2004-343092 | 12/2004 |
| JP | 2005-333117 | 12/2005 |
| KR | 10-2002-0016585 | 3/2002 |
| TW | 457553 B | 10/2001 |
| TW | 464960 A1 | 11/2001 |
| TW | 564465 A | 12/2003 |
| TW | 569350 B | 1/2004 |
| WO | WO-97/45827 | 12/1997 |
| WO | WO-98/24118 | 6/1998 |
| WO | WO-99/31719 | 6/1999 |
| WO | WO-00/14784 | 3/2000 |
| WO | WO-01/18854 A1 | 3/2001 |
| WO | WO-01/18855 | 3/2001 |
| WO | WO-01/71786 | 9/2001 |
| WO | WO-01/71791 | 9/2001 |
| WO | WO-01/73769 A1 | 10/2001 |
| WO | WO-02/31869 | 4/2002 |
| WO | WO-0231869 A2 | 4/2002 |
| WO | WO-02/42847 | 5/2002 |
| WO | WO-02/86954 | 5/2002 |
| WO | WO-02/086955 | 10/2002 |
| WO | WO-03/018882 | 3/2003 |
| WO | WO-03/046965 | 6/2003 |
| WO | WO-03/084688 | 10/2003 |
| WO | WO-2004/017379 | 2/2004 |
| WO | WO-2004/017380 | 2/2004 |
| WO | WO-2004/017381 | 2/2004 |
| WO | WO-2004/017382 | 2/2004 |
| WO | WO-2004017380 A2 | 2/2004 |
| WO | WO-2004/075263 | 9/2004 |
| WO | WO-2005/029546 | 3/2005 |
| WO | WO-2005/029548 | 3/2005 |
| WO | WO-2005/029550 | 3/2005 |
| WO | WO-2005/029551 | 3/2005 |
| WO | WO-2006/055003 A1 | 5/2006 |

OTHER PUBLICATIONS

Biegelsen, D.K., L.E. Fennell and J.C. Zesch, Origin of oriented crystal growth of radiantly melted silicon on SiO/sub 2, Appl. Phys. Lett. 45, 546 (1984).
Boyd, I. W., "Laser Processing of Thin Films and Microstructures, Oxidation, Deposition and Etching of Insulators," (Springer-Verlag Berlin Heidelber, 1987.
Broadbent et al., "Excimer Laser Processing of Al-1%Cu/TiW Interconnect Layers," Proceedings, Sixth International IEEE VLSI Multilevel Interconnection Conference, Santa Clara, CA, Jun. 12-13, pp. 336-345 (1989).
Brotherton et al., "Influence of Melt Depth in Laser Crystallized Poly-Si Thin Film Transistors," Journal of Appl. Phys., 82:4086 (1997).
Brotherton, "Polycrystalline Silicon Thin Film Transistors," Semicond. Sci. Tech., 10:721-738 (1995).
Brotherton, S.D., et al., Characterisation of poly-Si TFTs in Directionally Solidified SLS Si, Asia Display/IDW'01, p. 387-390.
Crowder et al., "Low-Temperature Single-Crystal Si TFT's Fabricated on Si Films Processed via Sequential Lateral Solidification," IEEE Electron Device Letter, 19 (8): 306 (1998).
Crowder et al., "Parametric Investigation of SLS-processed Polysilicon Thin Films for TFT Applications," Preparations and Characterization, Elsevier, Sequoia, NL, vol. 427, No. 1-2, Mar. 3, 2003, pp. 101-107, XP004417451.
Crowder et al., "Sequential Lateral Solidification of PECVD and Sputter Deposited a-Si Films", Mat. Res. Soc. Symp. Proc. 621:Q.9.7.1-9.7.6, 2000.
Dassow, R. et al. Laser-Crystallized Polycrystalline Silicon on Glass for Photovoltaic Applications, Solid State Phenomena, pp. 193-198, vols. 67-68, Scitec Publications, Switzerland.
Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.
Dassow, R. et al., Laser crystallization of silicon for high-performance thin-film transistors, Semicond. Sci. Technol., 2000, pp. L31-L34, vol. 15, UK.
Dimitriadis, C.A. et al., "Effect of pressure on the growth of crystallites of low-pressure chemical-vapor-deposited polycrystalline silicon films and the effective electron mobility under high normal field in thin-film transistors," J. Appl. Phys. 73 (12), Jun. 15, 1993, 8402-8411.
Endert et al., "Excimer Laser: A New Tool for Precision Micromachining," Optical and Quantum Electronics, 27:1319 (1995).
Fogarassy et al., "Pulsed Laser Crystallization of Hydrogen-Free a-Si Thin Films for High-Mobility Poly-Si TFT Fabrication," Applied Physics A—Solids and Surfaces, 56:365-373 (1993).
Geis et al., "Crystallographic orientation of silicon on an amorphous substrate using an artificial surface-relief grating and laser crystallization," Appl. Phys. Lett. 35(1) Jul. 1, 1979, 71-74.
Geis et al., "Silicon graphoepitaxy using a strip-heater oven," Appl. Phys. Lett. 37(5), Sep. 1, 1980, 454-456.
Geis et al., "Zone-Melting recrystallization of Si Films with a moveable-strip heater oven," J. Electro-Chem. Soc., 129: 2812 (1982).
Gosain et al., "Formation of (100)-Textured Si Film Using an Excimer Laser on a Glass Substrate," Jpn. J. Appl. Phys., vol. 42 (2003) pp. L135-L137.
Gupta et al., "Numerical Analysis of Excimer-laser induced melting and solidification of Si Thin Films", Applied Phys. Lett., 71:99, 1997.
Hau-Riege et al., "The Effects Microstructural Transitions at Width Transitions on interconnect reliability," Journal of Applied Physics, 87(12): 8467-8472.
Hawkins, W.G. et al., "Origin of lamellae in radiatively melted silicon flims," Appl. Phys. Lett. 42(4), Feb. 15, 1983.
Hayzelden, C. and J.L. Batstone, Silicide formation and silicide-mediated crystallization of nickel-implanted amorphous silicon thin films, J. Appl. Phys. 73, 8279 (1993).
Im et al., "Controlled Super-Lateral Growth of Si Films for Microstructural Manipulation and Optimization," Phys. Stat. Sol. (a), 166:603 (1998).
Im et al., "Crystalline Si Films for Integrated Active-Matrix Liquid-Crystals Displays," MRS Bulletin, 21:39 (1996).
Im et al., "On the Super Lateral Growth Phenomenon Observed in Excimer Laser-Induced Crystallization of Thin Si Films," Appl. Phys. Lett., 64 (17): 2303 (1994).
Im et al., "Phase Transformation Mechanisms Involved in Excimer Laser Crystallization of Amorphous Silicon Films," Appl. Phys. Lett., 63 (14): 1969 (1993).
Im et al., "Single-Crystal Si Films for Thin-Film Transistor Devices," Appl. Phys. Lett., 70(25): 3434 (1997).
Im, J.S., Method and system for producing crystalline thin films with a uniform crystalline orientation, U.S. Appl. No. 60/503,419; ref. file # 36013(BB); Columbia ref. M02-063.
Ishida et al., "Ultra-shallow boxlike profiles fabricated by pulsed ultraviolet-laser doping process," J. Vac. Sci. Technol. B 12(1): 399-403, (1994).

(56) References Cited

OTHER PUBLICATIONS

Ishihara et al., "A Novel Double-Pulse Excimer-Laser Crystallization Method of Silicon Thin-Films," Publication Office, Japanese Journal of Applied Physics, Tokyo, Japan, 34(8A): 3976-3981 (1995).
Jeon et al., "New Excimer Laser Recrystallization of Poly-Si for Effective Grain Growth and Grain Boundary Arrangement," Jpn. J. Appl. Phys. vol. 39 (2000) pp. 2012-2014, Part 1, No. 4B, Apr. 2000.
Jeon et al., "Two-step laser recrystallization of poly-Si for effective control of grain boundaries," Journal of Non Crystalline Solids, 266-269: 645-649 (2000).
Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.
Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.
Kahlert, H., "Creating Crystals," OE Magazine, Nov. 2001, 33-35.
Kim et al., "Grain Boundary Location-Controlled Poly-Si Films for TFT Devices Obtained Via Novel Excimer Laser Process," Mat. Res. Soc. Symp. Proc. vol. 358, 1995.
Kim et al., "Multiple Pulse Irradiation Effects in Excimer Laser-Induced Crystallization of Amorphous Si Films," Mat. Res. Soc. Sym. Proc., 321:665-670 (1994).
Kim, "Excimer-Laser-Induced Crystallization of Amorphous Silicon Thin Films," Ph. D. Dissertation Abstract, Columbia University, 1996.
Kim, C. et al., "Development of SLS-Based SOG Display," IDMC 2005, pp. 252-255.
Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.
Kim, H.-J., et al., "The effects of dopants on surface-energy-driven secondary grain growth in silicon films," J. Appl. Phys. 67 (2), Jan. 15, 1990.
Kim, H.J. et al., "New Excimer-laser-crystallization method for producing large-grained and grain boundary-location-controlled Si Films for Thin Film Transistors", Applied Phys. Lett., 68: 1513.
Kimura, M. and K. Egami, Influence of as-deposited film structure on (100) texture in laser-recrystallized silicon on fused quartz, Appl. Phys. Lett. 44, 420 (1984).
Knowles, D.S. et al., "P-59: Thin Beam Crystallization Method: a New Laser Annealing Tool with Lower Cost and Higher Yield for LTPS Panels," SID 00 Digest, pp. 1-3.
Kohler, J.R. et al., Large-grained polycrystalline silicon on glass by copper vapor laser annealing. Thin Solid Films, 1999, pp. 129-132, vol. 337, Elsevier.
Kung, K.T.Y. and R. Reif, Implant-dose dependence of grain size and (110) texture enhancements in polycrystalline Si films by seed selection through ion channeling, J. Appl. Phys. 59, 2422 (1986).
Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).
Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).
Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).
Lee, S.-W. and S.-K. Joo, Low temperature poly-Si thin-film transistor fabrication by metal-induced lateral crystallization, IEEE Electron Device Letters 17, 160 (1996).
Lee, S.-W., Y.-C. Jeon and S.-K. Joo, Pd induced lateral crystallization of amorphous Si thin films, Appl. Phys. Lett. 66, 1671 (1995).
Leonard, J.P. et al, "Stochastic modeling of solid nucleation in supercooled liquids", Appl. Phys. Lett. 78:22, May 28, 2001, 3454-3456.
Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.
Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.
Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on Insulator Devices, Eds. P.L.F. Hemment, Kluwer Academic Publishers 2000, pp. 55-61.
Mariucci et al., "Grain boundary location control by patterned metal film in excimer laser crystallized polysilicon," Proceedings of the Fifth International Conference on Polycrystalline Semiconductors, Schwabisch Gmund, Germany, 67-68: 175-180 (1998).
McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, 43(10): 946-948 (1983).
MICRO/LAS Lasersystem GMBH, "Overview of Beam Delivery Systems for Excimer Lasers," (1999).
MICRO/LAS Lasersystem GMBH, "UV Optics Systems for Excimer Laser Based Micromachining and Marking," (1999).
Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).
Miyata et al, "Low-Temperature Polycrystalline Silicon Thin-Film Transistors for Large-Area Liquid Crystal Display," Japanese J. of Applied Physics, Part 1—Regular Papers Short Notes & Review Papers, 31:4559-62 (1992).
Nebel, "Laser Interference Structuring of A-SI:h" Amorphous Silicon Technology—1996, San Francisco, CA Apr. 8-12, Materials Research Society Symposium Proceedings, vol. 420, Pittsburgh, PA (1996).
Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).
Noguchi, "Appearance of Single-Crystalline Properties in Fine-Patterned Si Thin Film Transistors (TFTs) by Solid Phase Crystallization (SPC)," Jpn. J. Appl. Phys., 32:L1584-L1587 (1993).
Ozawa et al., "Two-Dimensionally Position-Controlled Excimer-Laser-Crystallization of Silicon Thin Films on Glassy Substrate," Jpn. J. Appl. Phys. 38(10):5700-5705 (1999).
Sato et al., "Mobility anisotropy of electrons in inversion layers on oxidized silicon surfaces," Physical Review B (State) 4, 1950 (1971).
Smith, H.I. et al, "The Mechanism of Orientation in Si Graphoepitaxy by Laser Strip Heater Recrystallization," J. Electrochem. Soc.: Solid-State Science and Technology, vol. 130, No. 10, Oct. 1983, pp. 2050-2053.
Song et al., "Single Crystal Si Islands on SiO2 Obtained Via Excimer Laser Irradiation of a Patterned Si Film", Applied Phys. Lett., 68:3165, 1996.
Sposili et al., "Line-scan sequential lateral solidification of Si thin films", Appl. Phys. A67, 273-6, 1998.
Sposili et al., "Sequential Lateral Solidification of Thin Silicon Films on SiO2," Appl. Phys. Lett., 69(19): 2864 (1996).
Sposili et al., "Single-Crystal Si Films via a Low-Substrate-Temperature Excimer-Laser Crystallization Method," Mat. Res. Soc. Symp. Proc., 452: 953-958 (1997).
Thompson, C.V. and H.I. Smith, Surface-energy-driven secondary grain growth in ultrathin (<100 nm) films of silicon, Appl. Phys. Lett. 44, 603 (1984).
van der Wilt, P.C. et al., "State-of-the-Art Laser Crystallization of Si for Flat Panel Displays," PhAST, May 18, 2004, pp. 1-34.
van der Wilt, P.C. et al., "The Commercialization of the SLS Technology," Taiwan FPD, Jun. 11, 2004, pp. 1-12.
van der Wilt, P.C., "Textured poly-Si films for hybrid SLS," Jul. 2004, pp. 1-5.

(56) References Cited

OTHER PUBLICATIONS

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Watanabe et al., "Crystallization Process of Polycrystalline Silicon by KrF Excimer Laser Annealing," Japanese J. of Applied Physics, Part 1—Regular Papers Short Notes & Review Papers, 33:4491-98 (1994).

Weiner, K. H. et al. "Laser-assisted, Self-aligned Silicide Formation," A Verdant Technologies technical brief, Aug. 7, 1997, 1-9.

Weiner, K. H. et al., "Ultrashallow Junction Formation Using Projection Gas Immersion Laser Doping (PGILD)," A Verdant Technologies Technical Brief, Aug. 20, 1997.

Werner, J.H., et al. From polycrystalline to single crystalline silicon on glass, Thin Solid Films 383, 95-100, 2001.

White et al., "Characterization of thin-oxide MNOS memory transistors," IEEE Trans. Electron Devices ED-19, 1280 (1972).

Yamamuchi et al., "Polycrystalline silicon thin films processed with silicon ion implantation and subsequent solid-phase crystallization: Theory, experiments, and thin-film transistor applications," Journal of Applied Physics, 75(7):3235-3257 (1994).

Yoshimoto et al., "Excimer-Laser-Produced and Two-Dimensionally Position-Controlled Giant Si Grains on Organic SOG Underlayer," p. 285-286, AM-LCD (2000).

International Search Report and Written Opinion for International Patent Application No. PCT/US06/46405 mailed Jun. 6, 2008.

International Search Report for corresponding International Patent Application No. PCT/US2010/033565, dated Jul. 1, 2010, 1 page.

International Search Report for corresponding International Patent Application No. PCT/US2010/055106, dated Jan. 4, 2011, 1 page.

Andrä et al., "A new technology for crystalline silicon thin film solar cells on glass based on the laser crystallization," IEEE, pp. 217-220 (2000).

Andrä et al., "Multicrystalline LLC-SI thin film solar cells on low temperature glass," Poster, 3rd world Conference on Photovoltaic Energy Conversion, Osaka, Japan, pp. 1174-1177, May 11-18, 2003.

Sinke et al., "Explosive crystallization of amorphous silicon: Triggering and propagation," Applied Surface Science, vol. 43, pp. 128-135 (1989).

Van Der Wilt, "A hybrid approach for obtaining orientation-controlled single-crystal Si regions on glass substrates," Proc. of SPIE vol. 6106, 61060B-1 to B-15, (2006).

\* cited by examiner

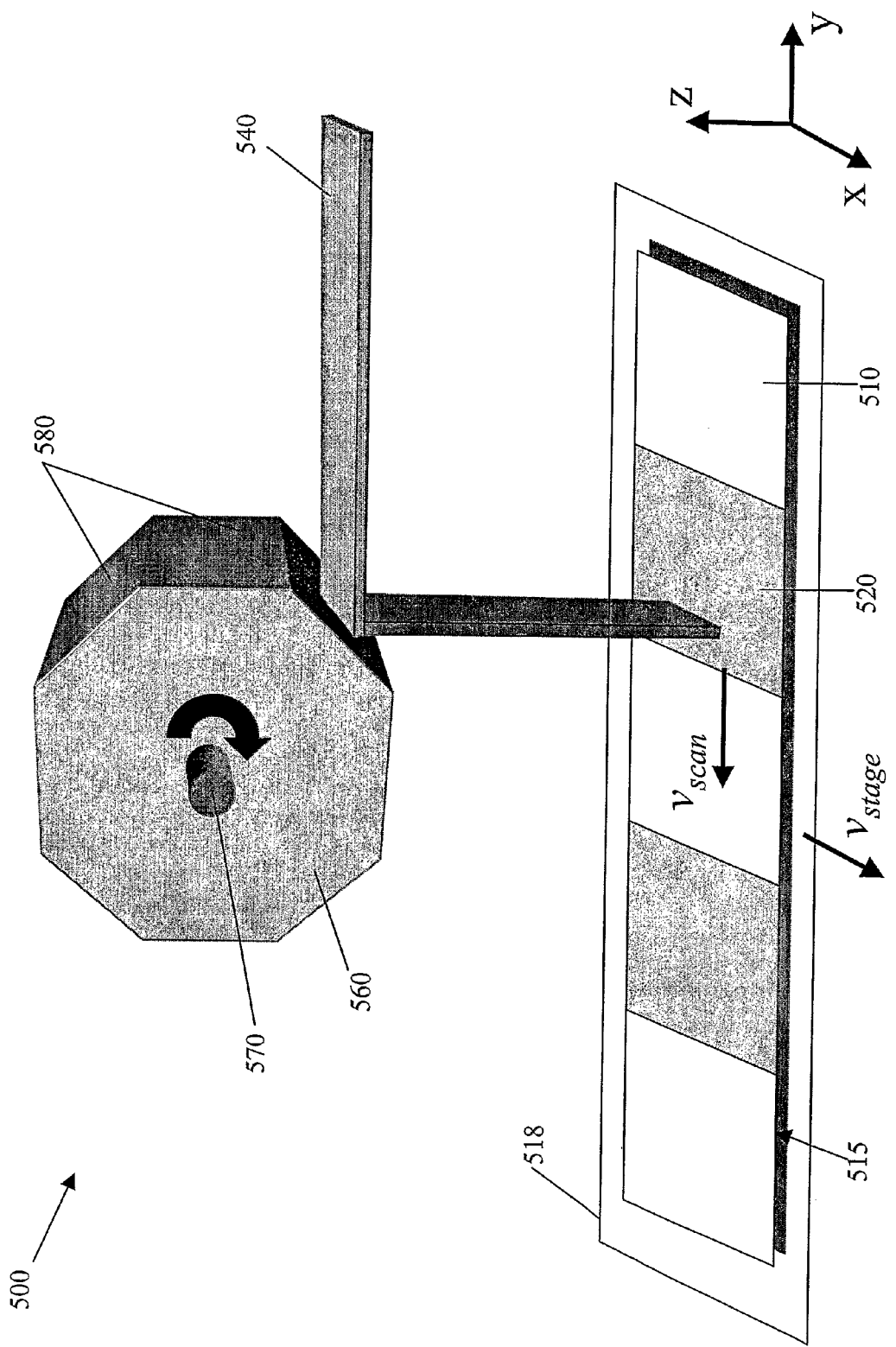

Random / Prior Art

Uniform / Prior Art

Directional / Prior Art

Single-crystal islands

SYSTEMS AND METHODS FOR PROCESSING A FILM, AND THIN FILMS

CROSS REFERENCE TO RELATED APPLICATIONS

This application is a U.S. National Phase Application under 35 U.S.C. §371 of International Patent Application No. PCT/US2006/046405, filed Dec. 5, 2006, entitled "SYSTEMS AND METHODS FOR PROCESSING A FILM, AND THIN FILMS," which claims the benefit under 35 U.S.C. §119(e) of the following application, the entire contents of each are incorporated herein by reference:

U.S. Provisional Patent Application Ser. No. 60/742,276, filed Dec. 5, 2005 and entitled "Scheme for Crystallizing Films Using a Continuous-Wave Light Source Compatible With Glass Substrates And Existing Precision Stages."

FIELD

Systems and methods for processing a film, and thin films, are provided.

BACKGROUND

In recent years, various techniques for crystallizing or improving the crystallinity of an amorphous or polycrystalline semiconductor film have been investigated. Such crystallized thin films may be used in the manufacture of a variety of devices, such as image sensors and active-matrix liquid-crystal display ("AMLCD") devices. In the latter, a regular array of thin-film transistors ("TFTs") is fabricated on an appropriate transparent substrate, and each transistor serves as a pixel controller.

Crystalline semiconductor films, such as silicon films, have been processed to provide pixels for liquid crystal displays using various laser processes including excimer laser annealing ("ELA") and sequential lateral solidification ("SLS") processes. SLS is well suited to process thin films for use in AMLCD devices, as well as organic light emitting diode ("OLED") devices.

In ELA, a region of the film is irradiated by an excimer laser to partially melt the film, which subsequently crystallizes. The process typically uses a long, narrow beam shape that is continuously advanced over the substrate surface, so that the beam can potentially irradiate the entire semiconductor thin film in a single scan across the surface. The Si film is irradiated multiple times to create the random polycrystalline film with a uniform grain size. ELA produces small-grained polycrystalline films; however, the method often suffers from microstructural non-uniformities, which can be caused by pulse-to-pulse energy density fluctuations and/or non-uniform beam intensity profiles. FIG. 6A illustrates a random microstructure that may be obtained with ELA. This figure, and all subsequent figures, are not drawn to scale, and are intended to be illustrative in nature.

SLS is a pulsed-laser crystallization process that can produce high quality polycrystalline films having large and uniform grains on substrates, including substrates that are intolerant to heat such as glass and plastics. SLS uses controlled laser pulses to fully melt a region of an amorphous or polycrystalline thin film on a substrate. The melted regions of film then laterally crystallize into a solidified lateral columnar microstructure or a plurality of location-controlled large single crystal regions. Generally, the melt/crystallization process is sequentially repeated over the surface of a large thin film, with a large number of laser pulses. The processed film on substrate is then used to produce one large display, or even divided to produce multiple displays, each display being useful for providing visual output in a given device. FIGS. 6B-6D shows schematic drawings of TFTs fabricated within films having different microstructures that can be obtained with SLS. SLS processes are described in greater detail below.

The potential success of SLS systems and methods for commercial use is related to the throughput with which the desired microstructure and texture can be produced. The amount of energy and time it takes to produce a film having the microstructure is also related to the cost of producing that film; in general, the faster and more efficiently the film can be produced, the more films can be produced in a given period of time, enabling higher production and thus higher potential revenues.

SUMMARY

The application describes systems and methods for processing thin films, and thin films.

In some embodiments, a method of processing a film is provided, the method comprising defining a plurality of spaced-apart regions to be pre-crystallized within the film, the film being disposed on a substrate and capable of laser-induced melting; generating a laser beam having a fluence that is selected to form a mixture of solid and liquid in the film and where a fraction of the film is molten throughout its thickness in an irradiated region; positioning the film relative to the laser beam in preparation for at least partially pre-crystallizing a first region of said plurality of spaced-apart regions; directing the laser beam onto a moving at least partially reflective optical element in the path of the laser beam, the moving optical element redirecting the beam so as to scan a first portion of the first region with the beam in a first direction at a first velocity, wherein the first velocity is selected such that the beam irradiates and forms the mixture of solid and liquid in the first portion of the first region, wherein said first portion of the first region upon cooling forms crystalline grains having predominantly the same crystallographic orientation in at least a single direction; and crystallizing at least the first portion of the first region using laser-induced melting.

Some embodiments include one or more of the following features. The laser beam is continuous-wave. Further comprising re-positioning the film relative to the laser beam in preparation for at least partially pre-crystallizing a second region of the plurality of spaced-apart regions; and moving the optical element so as to scan a first portion of the second region with the laser beam in the first direction at the first velocity, wherein the first portion of the second region upon cooling forms crystalline grains having predominantly the same crystallographic orientation in said at least a single direction. Said first velocity is further selected such that heat generated by the beam substantially does not damage the substrate. The moving optical element comprises a rotating disk that comprising a plurality of facets that reflect said laser beam onto the film. The first velocity is at least about 0.5 m/s. The first velocity is at least about 1 m/s.

The method of claim 1, further comprising, after redirecting the beam with the moving optical element so as to scan the first portion of the first region, translating the film relative to the laser beam in a second direction so as to scan a second portion of the first region with the laser beam in the first direction at the first velocity, wherein the second portion of the first region upon cooling forms crystalline grains having predominantly the same crystallographic orientation in said at least a single direction. The second portion of the first region partially overlaps the first portion of the first region. Continuously translating the film in the second direction with a second velocity selected to provide a pre-determined amount of overlap between the first and second portions of the first region. Continuously translating the film in the second direction with a second velocity for a period of time selected to sequentially irradiate and a plurality of portions of the first region, wherein each of said plurality of portions upon cooling forms crystalline grains having predominantly the same crystallographic orientation in said at least a single direction. Said crystallographic orientation in said at least a single direction is substantially normal to the surface of the film. Said crystallographic orientation in said at least a single direction is a <100> orientation. Crystallizing at least the first portion of the first region comprises performing uniform sequential lateral crystallization. The uniform sequential lateral crystallization comprises line-scan sequential lateral crystallization. Crystallizing at least the first portion of the first region comprises performing Dot sequential lateral crystallization. Crystallizing at least the first portion of the first region comprises performing controlled super-lateral growth crystallization. Crystallizing at least the first portion of the first region comprises forming crystals having a pre-determined crystallographic orientation suitable for a channel region of a driver TFT. Further comprising fabricating at least one thin film transistor in at least one of the first and second regions. Further comprising fabricating a plurality of thin film transistors in at least the first and second regions. Defining the plurality of spaced-apart regions comprises defining a width for each spaced-apart region that is at least as large as a device of circuit intended to be later fabricated in that region. Defining the plurality of spaced-apart regions comprises defining a width for each spaced-apart region that is at least as large as a width of a thin film transistor intended to be later fabricated in that region. The spaced-apart regions are separated by amorphous film. The film comprises at least one of a conductor and a semiconductor. The film comprises silicon. The substrate comprises glass. Shaping said laser beam using focusing optics.

Some embodiments provide a system for processing a film, the system comprising a laser source providing a laser beam having a fluence that is selected to form a mixture of solid and liquid in the film and where a fraction of the film is molten throughout its thickness in an irradiated region; a movable at least partially reflective optical element in the path of the laser beam capable of controllably redirecting the path of the laser beam; a stage for supporting the film and capable of translation in at least a first direction; and memory for storing a set of instructions, the instructions comprising defining a plurality of spaced-apart regions to be pre-crystallized within the film, the film being disposed on a substrate and capable of laser-induced melting; positioning the film relative to the laser beam in preparation for at least partially pre-crystallizing a first region of said plurality of spaced-apart regions; moving the movable optical element so as to scan a first portion of the first region with the beam in the first direction at a first velocity, wherein the first velocity is selected such that the beam forms a mixture of solid and liquid in the film and where a fraction of the film is molten throughout its thickness in the first portion of the first region, wherein said first portion of the first region upon cooling forms crystalline grains having predominantly the same crystallographic orientation in at least a single direction.

Some embodiments include one or more of the following features. The laser beam is continuous-wave. Re-positioning the film relative to the laser beam in preparation for at least partially re-crystallizing a second region of the plurality of spaced-apart regions; and moving the movable optical element so as to scan a first portion of the second region with the beam in the first direction at the first velocity, wherein the first portion of the second region upon cooling forms crystalline grains having predominantly the same crystallographic orientation in said at least a single direction. The first velocity is further selected such that heat generated by the beam substantially does not damage the substrate. The movable optical element comprises a disk comprising a plurality of facets that at least partially reflect said laser beam onto the film. The first velocity is at least about 0.5 m/s. The first velocity is at least about 1 m/s. The memory further includes instructions to, after moving the movable optical element so as to scan the first portion of the first region, translate the film relative to the laser beam in a second direction so as to scan a second portion of the first region with the laser beam in the first direction at the first velocity, wherein the second portion of the first region upon cooling forms crystalline grains having predominantly the same crystallographic orientation in said at least a single direction. The memory further includes instructions to partially overlap the first and second portions of the first region. The memory further includes instructions to continuously translate the film in the second direction with a second velocity selected to provide a pre-determined amount of overlap between the first and second portions of the first region. The memory further includes instructions to continuously translate the film in the second direction with the second velocity for a period of time selected to sequentially irradiate and partially melt a plurality of portions of the first region, wherein each of said plurality of portions upon cooling forms crystalline grains having predominantly the same crystallographic orientation in said at least a single direction. The memory further includes instructions to perform uniform sequential lateral crystallization in at least the first region. The memory further includes instructions for defining a width for each spaced-apart region that is at least as large as a device or circuit intended to be later fabricated in that region. The memory further includes instructions for defining a width for each spaced-apart region that is at least as large as a width of a thin film transistor intended to be later fabricated in that region. The film comprises at least one of a conductor and a semiconductor. The film comprises silicon. The substrate comprises glass. Further comprising laser optics to shape said laser beam.

Some embodiments provide a thin film, the thin film comprising columns of pre-crystallized film positioned and sized so that rows and columns of TFTs can later be fabricated in said columns of pre-crystallized film, said columns of pre-crystallized film comprising crystalline grains having predominantly the same crystallographic orientation in at least a single direction; and columns of untreated film between said columns of pre-crystallized film.

Some embodiments include one or more of the following features. Said crystallographic orientation in said at least a single direction is substantially normal to the surface of the film. Said crystallographic orientation in said at least a single direction is a <100> orientation. The columns of untreated film comprise amorphous film.

Some embodiments provide a method of processing a film, the method comprising defining at least one region within the film, the film being disposed on a substrate and capable of laser-induced melting; generating a laser beam having a fluence that is selected to form a mixture of solid and liquid in the film and where a fraction of the film is molten throughout its thickness in an irradiated region; directing the laser beam onto a moving optical element that is at least partially reflective, said moving optical element directing the laser beam across a first portion of the first region in a first direction at a first velocity; moving the film relative to the laser beam in a second direction and at a second velocity to displace the film along the second direction during laser irradiation of the first portion while moving the optical element, wherein said first portion of the first region upon cooling forms crystalline grains having predominantly the same crystallographic orientation in at least a single direction, wherein the first velocity is selected such that the beam irradiates and forms a mixture of solids and liquid in the first portion of the film; and repeating the steps of moving the optical element and moving the film at least once to crystallize the first region.

Some embodiments include one or more of the following features. The laser beam is continuous-wave. Further comprising re-positioning the film relative to the laser beam in preparation for at least partially pre-crystallizing a second region of the plurality of spaced-apart regions; and moving the optical element so as to scan a first portion of the second region with the laser beam in the first direction at the first velocity, wherein the first portion of the second region upon cooling forms crystalline grains having predominantly the same crystallographic orientation in said at least a single direction. Said first velocity is further selected to avoid heat generation by the beam that damages the substrate. Directing the moving optical element comprises rotating a disk that comprises a plurality of facets that reflect said laser beam onto the film. The first velocity is at least about 0.5 m/s. The first velocity is at least about 1 m/s. The steps of moving the optical element and moving the film provide first and second portions of the first region having predominantly the same crystallographic orientation and the second portion of the first region partially overlaps the first portion of the first region. Continuously translating the film in the second direction with a second velocity selected to provide a pre-determined amount of overlap between the first and second portions of the first region. Continuously translating the film in the second direction with a second velocity for a period of time selected to sequentially irradiate and partially melt a plurality of portions of the first region, wherein each of said plurality of portions upon cooling forms crystalline grains having predominantly the same crystallographic orientation in said at least a single direction. Said crystallographic orientation in said at least a single direction is substantially normal to the surface of the film. Said crystallographic orientation in said at least a single direction is a <100> orientation. Further comprising subjecting the film to a subsequent sequential lateral crystallization process to generate location controlled grains having wherein crystallizing at least the first portion of the first region comprises performing uniform sequential lateral crystallization. The uniform sequential lateral crystallization comprises line-scan sequential lateral crystallization. Crystallizing at least the first portion of the first region comprises performing Dot sequential lateral crystallization. Crystallizing at least the first portion of the first region comprises performing controlled super-lateral growth crystallization. Crystallizing at least the first portion of the first region comprises forming crystals having a pre-determined crystallographic orientation suitable for a channel region of a driver TFT. Further comprising fabricating at least one thin film transistor in at least one of the first and second regions. Further comprising fabricating a plurality of thin film transistors in at least the first and second regions. Defining the plurality of spaced-apart regions comprises defining a width for each spaced-apart region that is at least as large as a device or circuit intended to be later fabricated in that region. Defining the plurality of spaced-apart regions comprises defining a width for each spaced-apart region that is at least as large as a width of a thin film transistor intended to be later fabricated in that region. The spaced-apart regions are separated by amorphous film. The film comprises at least one of a conductor and a semiconductor. The film comprises silicon. The substrate comprises glass. Shaping said laser beam using focusing optics.

DESCRIPTION OF THE DRAWINGS

In the drawing:

FIG. 3 is a schematic diagram of an apparatus for high throughput pre-crystallization of a thin film according to some embodiments.

DETAILED DESCRIPTION

Figure 1:
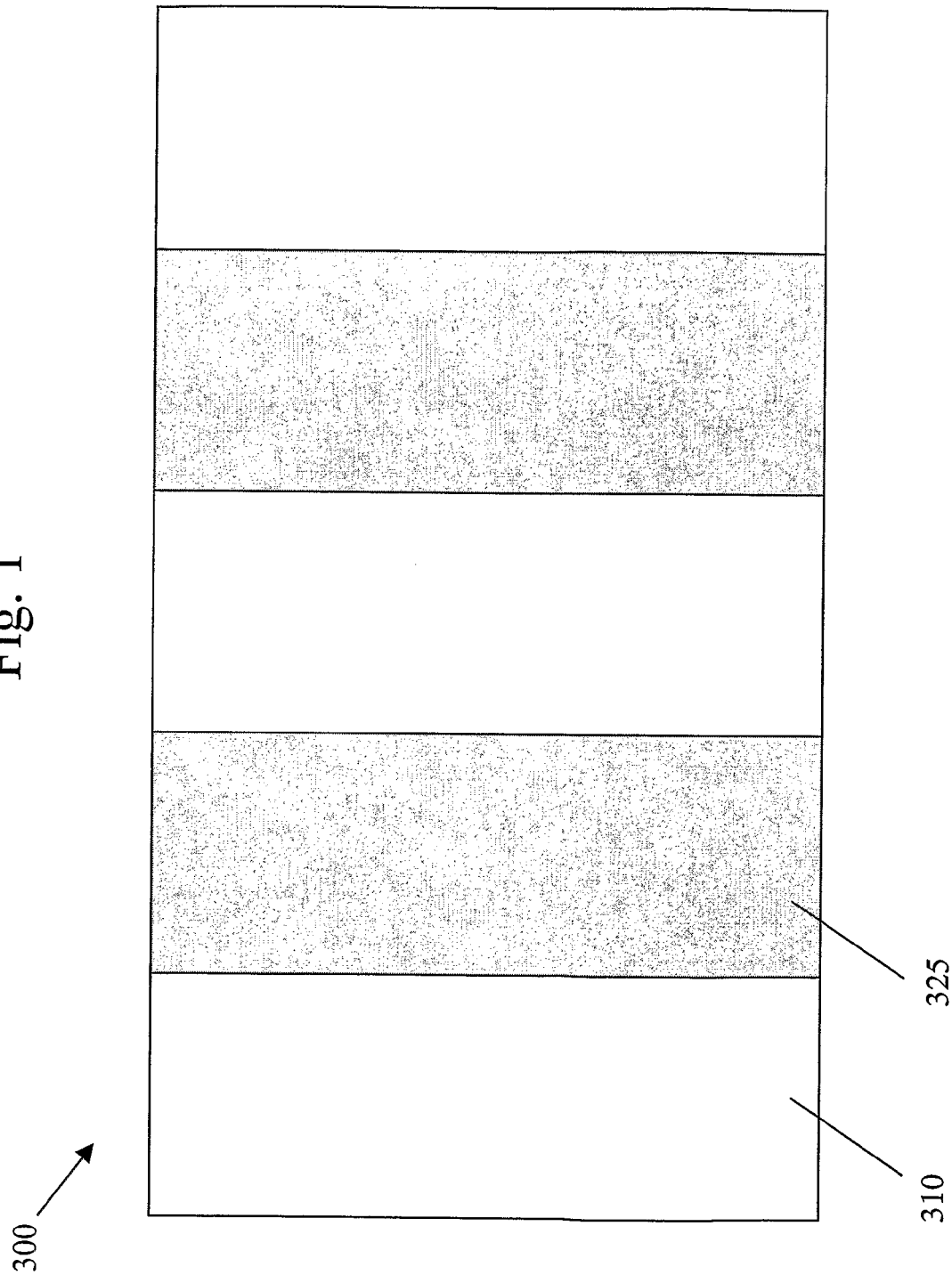
FIG. 1 illustrates a thin film with regions pre-crystallized with high throughput pre-crystallization according to some embodiments.

Systems and methods described herein provide pre-crystallized thin films having controlled crystallographic texture. The textured films contain grains having predominantly the same crystallographic orientation in at least a single crystallographic orientation. The thin films are suitable for further processing with SLS or other lateral growth processes, as discussed in greater detail below. In SLS, the crystal orientation of lateral growth during SLS depends on the orientation of the material at the boundary of the irradiated region. By pre-crystallizing the film before performing SLS, the crystals that laterally grow during SLS adopt the crystalline orientation generated during pre-crystallization, and thus grow with an improved crystalline orientation relative to crystal grains grown without pre-crystallization. The pre-crystallized and laterally crystallized film can then be processed to form TFTs, and ultimately be used as a display device.

When a polycrystalline material is used to fabricate devices having TFTs, the total resistance to carrier transport within the TFT channel is affected by the combination of barriers that a carrier has to cross as it travels under the influence of a given potential. Within a material processed by SLS, a carrier crosses many more grain boundaries if it travels perpendicularly to the long grain axes of the polycrystalline material, and thus experiences a higher resistance, than if it travels parallel to the long grain axes. Thus, in general, the performance of TFT devices fabricated on SLS-processed polycrystalline films depends on the microstructure of the film in the channel, relative to the film's long grain axes. However, SLS is not able to fully define the crystallographic texture of those grains, because they grow epitaxially from existing grains that do not themselves necessarily have a well-defined crystallographic texture.

Pre-crystallizing a thin film can improve the crystal alignment, e.g., texture, obtained during subsequent lateral crystallization processes, and can allow separate control and optimization of the texture and the microstructure of the film. Pre-crystallizing the film generates a textured film having crystal grains with predominantly the same crystallographic orientation in at least one direction. For example, if one crystallographic axis of most crystallites in a thin polycrystalline film points preferentially in a given direction, the film is referred to as having a one-axial texture. For many embodiments described herein, the preferential direction of the one-axial texture is a direction normal to the surface of the crystallites. Thus, "texture" refers to a one-axial surface texture of the grains as used herein. In some embodiments, the crystallites have a (100) texture. The degree of texture can vary depending on the particular application. For example, a high degree of texture can improve the performance of thin film transistor (TFT) being used for a driver circuit, but not provide as significant a benefit to a TFT that is used for a switch circuit.

One method that can be used to pre-crystallize a film is known as mixed-phase zone-melt recrystallization (ZMR), which, in some embodiments, uses a continuous wave (CW) laser beam to partially melt a silicon film and thus produce a film having a desired texture, e.g., (100) texture. In ZMR, irradiation causes some parts of the film to completely melt while others remain unmelted, forming a "transition region" which exists as a result of a significant increase in reflectivity of Si upon melting (a semiconductor-metal transition). Crystal grains having (100) texture form in this transition region. For further details, see U.S. Patent Publication No. 2006/0102901, entitled "Systems and Methods for Creating Crystallographic-Orientation Controlled poly-Silicon Films," the entire contents of which are incorporated herein by reference. The texture of a pre-crystallized film can be further improved by scanning the film multiple times, as preferably oriented grains get enlarged at the expense of less preferably oriented grains. For further details, see U.S. Provisional Patent Application No. 60/707,587, the entire contents of which are incorporated herein by reference. For further general details on ZMR, see M. W. Geis et al., "Zone-Melting recrystallization of Si films with a movable-strip-heater oven," J. Electro-Chem. Soc. 129, 2812 (1982), the entire contents of which are incorporated herein by reference.

However, pre-crystallizing an entire panel to get (100) large-grain material can be time consuming, as typical CW laser sources have limited power. Additionally, pre-crystallizing a silicon film with a CW laser can significantly heat the film and underlying substrate due to the continuous radiation. For glass substrates, sufficient heat can be generated to cause the substrate to warp or actually melt and damage the substrate. In general, a glass substrate benefits from a scan velocity of at least about 1 m/s in order to avoid damage. However, as substrate sizes increase, this velocity becomes increasingly difficult to achieve; for example, current panel sizes in so-called low-temperature polycrystalline silicon (LTPS) technology, commonly used for mobile (small-display) applications, are up to ~720 mm×930 mm (which can be divided into 4 or more devices) or larger. Currently available stage technology typically limits scan velocities to a few cm/s or a few 10's of cm/s, as is used in normal SLS processes. Thus, conventional pre-crystallization using a CW laser is not readily applied to large substrates. Although heat-resistant substrates can be used, they are more costly and are less attractive for large-area electronic applications.

The pre-crystallization systems and methods described herein allow the film to be scanned at high scan velocities, which helps to prevent heat damage to the underlying substrate. The systems can use conventional (e.g., relatively slow) handling stages to move large substrates, and at the same time can provide scan velocities of about 1 m/s, or even higher. Specifically, a handling stage moves the film and substrate at a typical scan velocity in one direction, while moving optics scan a laser beam across the film at a much higher velocity in a different, e.g., perpendicular, direction. The motions of the stage and laser beam are coordinated so that defined regions of the film are pre-crystallized, and other regions are left untreated. This increases the effective scanning velocity of the film above a threshold at which the substrate would be damaged, and greatly improves the efficiency of pre-crystallizing the film.

The systems and methods also are capable of reducing the overall time to process the film. Specifically, the film is pre-crystallized in regions of the film where devices that benefit from controlled crystallographic texture, e.g., regions that contain the most demanding circuitry, will be fabricated. In some embodiments, these regions are on the periphery of a display, where the integration TFTs will be fabricated. Regions of the film where such devices will not be located, or devices not requiring controlled crystallographic texture, are not pre-crystallized. In some embodiments, the speed with which panels are pre-crystallized are approximately matched to the throughput rate of SLS systems and methods, with which the pre-crystallization systems and methods can be incorporated.

FIG. 1 illustrates an embodiment of a silicon film 300 that is pre-crystallized in defined regions, and left untreated in other regions. The defined regions can be selected for a variety of reasons, such as that devices benefiting from improved crystalline texture will eventually be fabricated there. In some embodiments, the defined regions correspond to TFT channels. The film includes areas of pre-crystallized silicon 325, and areas of untreated silicon 310. The areas are positioned and sized so that rows and columns of TFTs can optionally be subsequently fabricated within the areas of pre-crystallized silicon 325, e.g., with SLS and other processing steps. The untreated regions 310 can be uncrystallized silicon, e.g., amorphous silicon, or can be, e.g., polycrystalline silicon.

Although the areas of untreated and pre-crystallized silicon are illustrated to have approximately the same width, the area widths and relative spacing can vary, depending on the desired area of the display and the width of the integration regions. For example, the integration regions can be only several mm wide for a display that can have a diagonal of several inches. In this case, the pre-crystallized silicon columns 325 can be fabricated to be substantially narrower than the untreated areas 310. This will further improve the efficiency with which the film can be processed, because large regions of the film will not need to be pre-crystallized. In general, the width of the pre-crystallized regions needs only to be long enough to cover the area for integration circuits.

Figure 2:
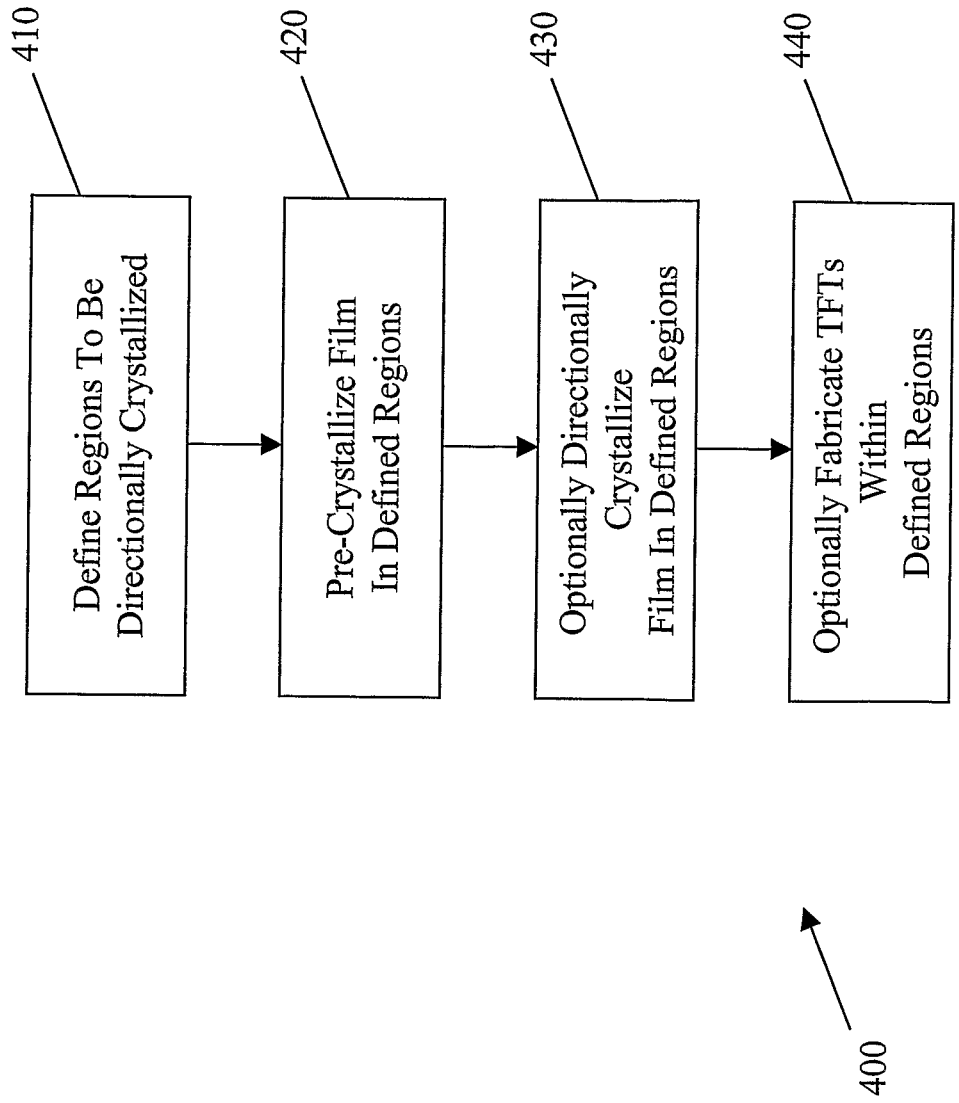
FIG. 2 illustratively displays a method for the high throughput pre-crystallization of a thin film and optional subsequent TFT fabrication according to some embodiments.

FIG. 2 illustratively displays a method 400 for the high throughput pre-crystallization, and optional subsequent processing of a semiconductor film to form TFTs, according to certain embodiments. First, the regions to be pre-crystallized are defined (410). The defined regions optionally correspond to areas in which TFT circuits will be fabricated, as described above. The area widths and spacings are selected according to the requirements of the device that will eventually be fabricated using the film.

Then, the film is pre-crystallized in the defined regions (420). In some embodiments, this is done with a continuous wave (CW) laser as described in greater detail below. The laser partially melts the film, which crystallizes to have a desired texture. The textured film contains grains having predominantly the same crystallographic orientation in at least a single direction. However, the grains are randomly located on the film surface, and are of no particular size.

Then, the film is optionally laterally crystallized (430). In many embodiments, this is done with SLS processes, for example as described in greater detail below. For further details and other SLS processes, see U.S. Pat. Nos. 6,322,625, 6,368,945, 6,555,449, and 6,573,531, the entire contents of which are incorporated herein by reference.

Figure 6A:
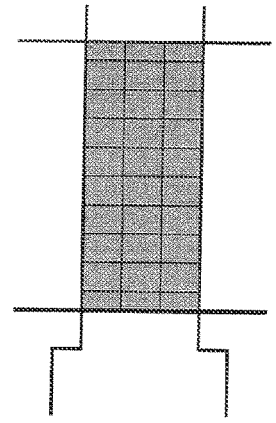
FIG. 6A illustrates crystalline microstructures formed by excimer laser annealing.
Figure 6B:
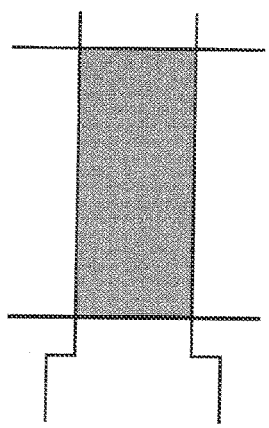
FIGS. 6B-6D illustrate crystalline microstructures formed by sequential lateral crystallization.
Figure 6C:
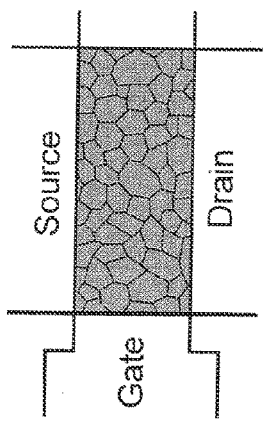
Figure 6D:
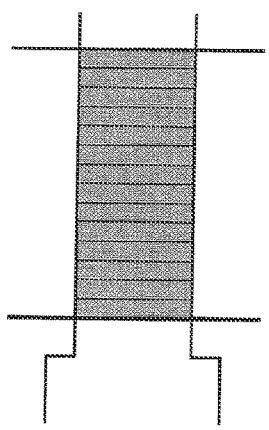

Then, TFTs are optionally fabricated within the defined regions (440). This can be done with silicon island formation, in which the film is etched to remove excess silicon except where the TFTs are to be fabricated. Then, the remaining "islands" are processed using techniques known in the art to form active TFTs, including source and drain contact regions as illustrated in FIG. 6A.

Note that in general, even if defined regions of a given film are pre-crystallized and the remaining regions left untreated, the SLS process need not be performed solely within the pre-crystallized regions. For example, the entire film, or portions thereof, can be laterally crystallized with SLS. Then, TFTs can be fabricated at desired locations within the laterally crystallized regions of the film, such that some or all of the TFTs are fabricated within the regions that were originally pre-crystallized. Determining which steps to perform on a given region of the film depends on the performance requirements of the finished device.

FIG. 3 schematically illustrates an embodiment of a system that can be used for precrystallizing a thin film. The system includes a rotating disk with a plurality of facets, each of which is at least partially reflective for the laser beam wavelength. The laser beam is directed at the rotating disk, which is arranged such that the facets redirects the laser beam so that it irradiates the film. As the disk rotates, it causes the laser beam to scan the surface of the film, thus pre-crystallizing successive portions of the film. As the disk continues to rotate, each new facet that reflects the laser beam effectively "resets" the position of the beam relative to the film in the direction of rotation, bringing the laser beam back to its starting point on the film in that direction. At the same time, the film is translated in another direction, e.g., perpendicular to the scan direction, so that as the disk continues to rotate, new facets reflect the laser beam onto successive portions of the film that are displaced from each other in the second direction. Thus, an entire region of the thin film can be pre-crystallized.

As illustrated in FIG. 3, pre-crystallization system 500 that can be used to pre-crystallize a thin film 515 within defined region 520. A laser (not shown), e.g., an 18 W, 2ω Nd:YVO$_4$ Verdi laser from Coherent Inc., generates a CW laser beam 540. One or more optics (also not shown) shape laser beam 540 so that it forms a thin line beam. In some embodiments, the beam has a length of between about 1-15 mm, a width of between about 5-50 μm, and a fluence of between about 10-150 W/mm of beam length. Note, however, that the beam may have any desired length, and in some cases may be a "line beam" having a very high length to width aspect ratio (e.g., about 50-10$^5$), and may even extend for the full length of the panel being irradiated. In this case, the film need not be scanned in the second direction, because the entire length of a given region will be irradiated at once. In some embodiments, the beam has approximately uniform energy along the long axis, although in other embodiments the beam will have other energy profiles such as Gaussian or sinusoidal. In some embodiments, the beam along the short axis has a "top hat" energy profile, i.e., having substantially equal energy across the short axis profile of the beam, and in other embodiments, the beam has a tightly focused Gaussian profile along the short axis. Other energy profiles, and other beam sizes, are possible and can be selected according to the performance requirements of the finished device. The overall beam power, as well as the size of the beam, is selected to provide a sufficient energy density to partially melt the film 515 so that it recrystallizes with the desired amount of texture. One of skill in the art would be able to readily select appropriate lasers and optics to achieve a desired beam profile, wavelength, and energy. Note that the laser beam need not be CW, but can also have any suitable temporal profile, for example sufficiently long pulses to partially melt the irradiated regions, or have a relatively high repetition rate ("quasi-CW").

The laser beam is directed towards a rotating disk 560 having a plurality of at least partially reflective surfaces or facets 580. Reflective facets 580 of disk 560 are positioned relative to film 575 so as to direct laser beam 540 towards the film surface. Specifically facets 580 are arranged so as to redirect laser beam 540 so that it irradiates film 515 within defined region 520. Where the laser beam irradiates region 520, it partially melts the film, which crystallizes upon cooling as described in greater detail in U.S. Patent Publication No. 2006/0102901. Disk 560 rotates about axis 570. This rotation moves facets 580 relative to laser beam 540, so that they behave as a moving mirror for the laser beam, and guide the beam in a line across the substrate. The movement of facets 580 move laser beam 540 rapidly relative to film 515 in the (-y) direction. The relative velocity $v_{scan}$ of the beam relative to the film 515 in the (-y) direction is determined by the speed of rotation of disk 560. The velocity of the beam imparted by the disk is substantially higher than could be generated by moving the substrate with a typical mechanical stage. At the same time, stage 518 moves film 515 in the (+x) direction with a velocity $v_{stage}$, perpendicular to the direction of beam motion. Thus, the total beam velocity relative to a given point of the film can be substantially higher than normally achievable using stage 518 alone. Furthermore the irradiation pattern of the film surface is defined by the state scanning speed and direction as well as the facet size and rotation rate of the disk, as well as the distance between the disk and the film.

While FIG. 3 shows faceted disk 560 with eight facets 580, this number of facets is meant to be illustrative only. In general, other ways of deflecting the beam in order to provide high velocity scanning are contemplated, for example, a single movable mirror. Or, for example, other numbers of facets can be used, according to the desired processing speed and size of pre-crystallized regions 520.

Figure 4A:
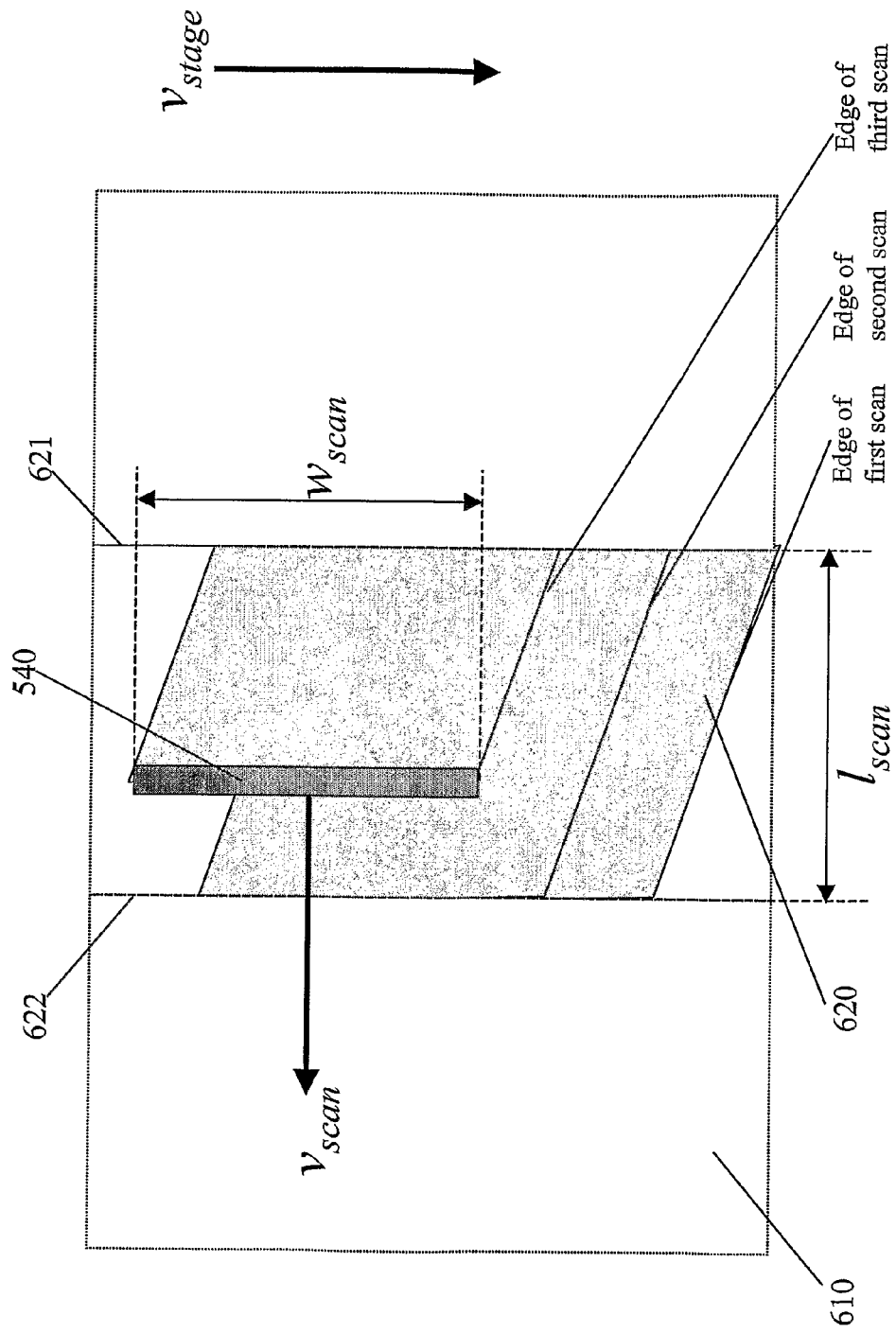
FIG. 4A-4B illustrates the pre-crystallization of a TFT region using a high throughput pre-crystallization apparatus according to some embodiments.

FIG. 4A illustrates a detailed view of the path of laser beam 540 relative to the substrate 610. As disk 560 rotates, a first facet 580 reflects beam 540 so that it first irradiates substrate 610 at a first edge 621 of the defined film region 620 to be pre-crystallized, starting a "first scan" of the region. Disk 560 continues to rotate the given facet 580, so that the beam moves across film region 620 in the (-y) direction with a velocity $v_{scan}$. At the same time, stage 518 moves substrate 610 in the (+x) direction with a velocity $v_{stage}$ resulting in a diagonal crystallization path. Wherever beam 540 irradiates defined film region 620, it partially melts the film, which upon cooling recrystallizes with texture as described above. Thus, as can be seen in FIG. 6A, the width $w_{scan}$ of a particular scanned region is defined by the length of the laser beam in that region, and the edge of the scanned region follows a "diagonal" path relative to the substrate, defined by $v_{scan}$ and $v_{stage}$, as described in greater detail below.

As disk 560 continues to rotate, the first facet 580 eventually rotates far enough that it no longer reflects beam 540. When this happens, the beam stops irradiating the defined region 620 at second edge 622 which coincides with the other edge defining the preselected region 620. With continued rotation of disk 560, the laser beam 540 is directed onto a second facet 580. Second facet 580 redirects laser beam 540 so that it irradiates substrate 610 at a first edge 621 of the defined film region 620, starting a "second scan" of the region. At the beginning of the second scan, the stage has moved the substrate 610 by a predetermined distance (based on stage velocity) in the (+x) direction relative to where it was at the beginning of the first scan. This yields an offset in the (+x) between the edge of the first scan and the edge of the second scan that is determined by stage speed $v_{stage}$. This offset can be chosen to provide a desired amount of overlap between the first and second scans. As mentioned above, pre-crystallizing a film multiple times can enlarge the size of preferably oriented grains, so it may be desirable to use a relatively small offset to provide a large amount of overlap between the first and second scanned areas.

As disk 560 continues to rotate, second facet 580 moves the beam 540 across region 620 in the (−y) direction, and stage 518 moves substrate 610 in the (+x) direction. Eventually the second facet 580 moves out of the path of beam 540, and a third facet 580 reflects the beam 540 to irradiate region 620, again offset in the (+x) direction by an amount determined by speed $v_{stage}$. In this way, as disk 560 continues to rotate and stage 518 moves the substrate 610, defined film region 620 is substantially pre-crystallized, while other regions of substrate 610 are not pre-crystallized and remain, e.g., amorphous silicon. After completing the pre-crystallization of region 620, the stage moves the substrate 610 in the (−x) and (+y) or (−y) direction, so that a new region can be pre-crystallized as described above.

Although FIG. 4A shows a non-pre-crystallized area at the bottom of defined film region 620, resulting from the "diagonal" motion of the beam relative to the substrate, this area can be pre-crystallized by simply starting the first scan below the edge of the substrate. Alternately, the bottom of the substrate can be trimmed, or TFTs simply not fabricated on that particular area.

Figure 4B:
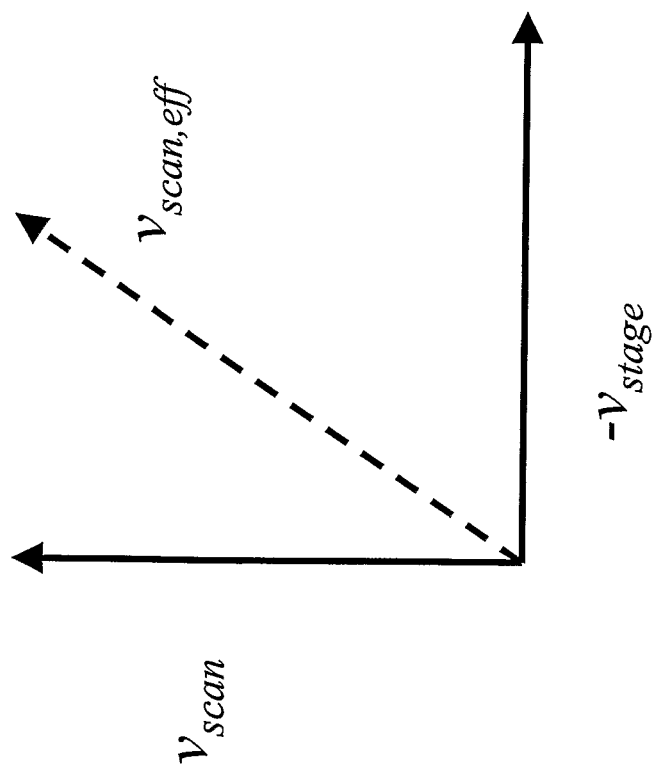

As illustrated in FIG. 4B, the combination of beam velocity $v_{scan}$ in the (−y) direction and stage velocity $v_{stage}$ in the (+x) direction yields an effective scan velocity $v_{scan,eff}$. This velocity $v_{scan,eff}$ is selected so that the beam travels fast enough not to damage the substrate 610, but slow enough to partially melt the defined film region 620 to the desired degree.

Assuming that the beam 540 moves in only one direction (although it can be bidirectional), and continuously irradiates the film, the frequency of scanning $f_{scan}$ is given by:

$$f_{scan} = \frac{v_{scan}}{l_{scan}}$$

where $v_{scan}$ is the scan velocity, as described above, and $l_{scan}$ is the length of the region to be scanned, i.e., the y-dimension of the pre-treated area. As an example, for a scan velocity $v_{scan}$ of 1 m/s and a scan length lscan of 4 mm, the scan frequency will be 250 Hz.

For a certain number of scans per unit area n, the beam width $w_{scan}$ follows from:

$$w_{scan} = \frac{n \cdot v_{stage}}{f_{scan}}$$

where $v_{stage}$ is the velocity of the stage. So, in addition to the exemplary numbers above, if n=10 scans per unit area are desired and the stage velocity $v_{stage}$ is approximately 20 cm/s, then the beam width $w_{scan}$ is approximately 8 mm.

In order to remain within the margins of the partial melting regime, the scanning velocity is held to be substantially constant, as opposed to following, for example, a sinusoid trace. In the described embodiment, disk 560 rotates at a substantially constant speed, which causes beam 540 to also move at a substantially constant speed. Translation of the stage allows a new region to be pre-crystallized.

In some embodiments, the semiconductor film is first pre-crystallized in defined regions, and then laterally crystallized everywhere. The pre-crystallized regions will have more highly aligned crystals than the non-pre-crystallized regions, although all the regions of the film will be laterally crystallized. The regions that are both pre-crystallized and laterally crystallized can be used to fabricate devices that are particularly sensitive to microstructure, such as integration TFTs; the non-pre-crystallized regions can be used to fabricate devices that are less sensitive to microstructure, but still benefit from lateral crystals, such as pixel TFTs. Pre-crystallizing the film only in regions needing improved crystalline alignment can save time and energy over pre-crystallizing the entire semiconductor film.

In some embodiments, the semiconductor film is laterally crystallized following pre-crystallization. One suitable protocol, referred to herein as "uniform-grain sequential lateral solidification," or "uniform SLS," may be used to prepare a uniform crystalline film characterized by repeating columns of laterally elongated crystals. Uniform crystal growth is described with reference to FIGS. 7A-7D. The crystallization protocol involves advancing the film by an amount greater than the characteristic lateral growth length, e.g., δ>LGL, where δ is the translation distance between pulses, and less than two times the characteristic lateral growth length, e.g., δ<2 LGL. The term "characteristic lateral growth length" (LGL) refers to the characteristic distance the crystals grow when cooling. The LGL is a function of the film composition, film thickness, the substrate temperature, the laser pulse characteristics, the buffer layer material, if any, and the optical configuration. Fro example, a typical LGL for 50 nm thick silicon films is approximately 1-5 µm or about 2.5 µm. The actual growth may be limited by other laterally growing fronts, e.g., where two fronts collide as illustrated below.

Figure 7C:
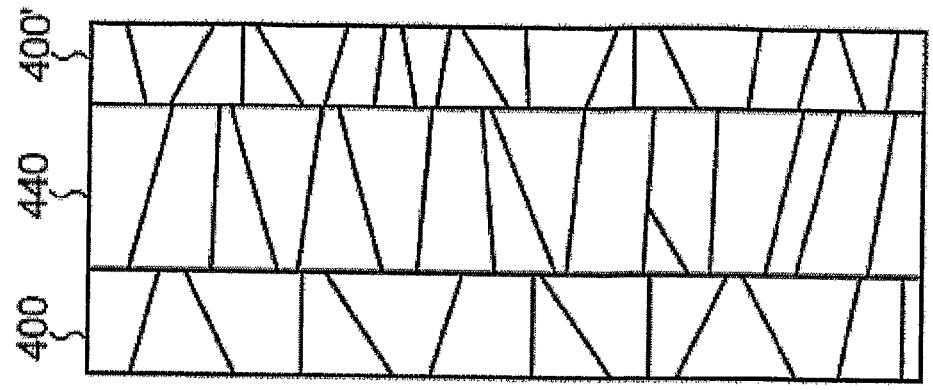
FIGS. 7A-7D illustrate schematically processes involved in and microstructures formed by sequential lateral crystallization according to some embodiments.
Figure 7B:
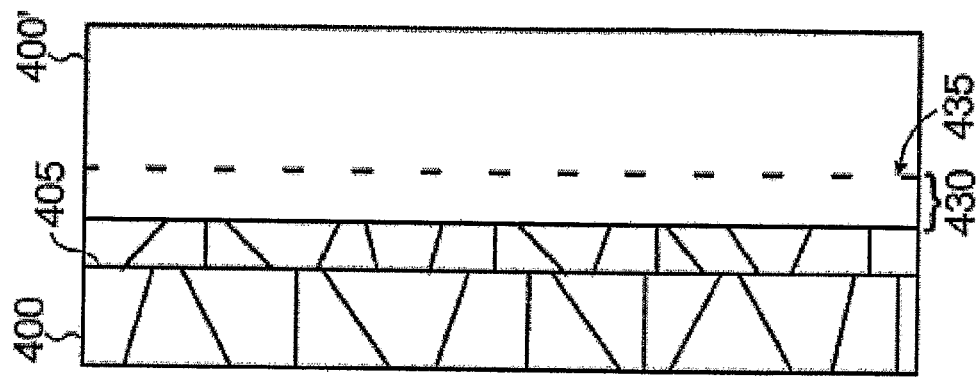
Figure 7A:
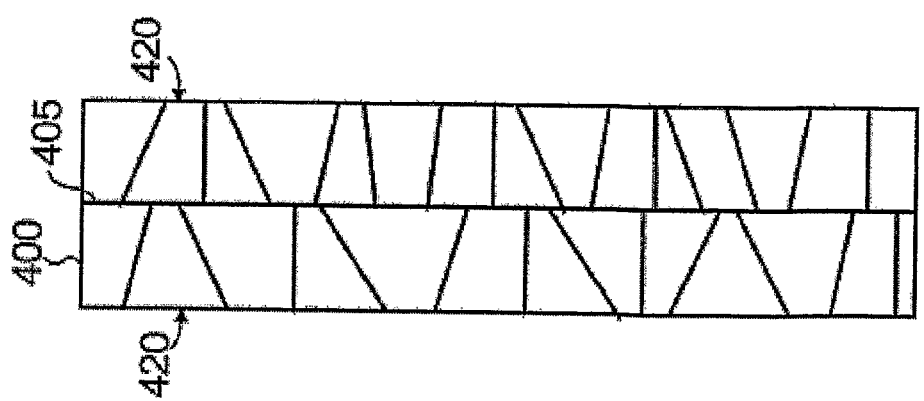

Referring to FIG. 7A, a first irradiation is carried out on a film with a narrow, e.g., less than two times the lateral growth length, and elongated, e.g., greater than 10 mm and up to or greater than 1000 mm, laser beam pulse having an energy density sufficient to completely melt the film. As a result, the film exposed to the laser beam (shown as region 400 in FIG. 7A), is melted completely and then crystallized. In this case, grains grow laterally from an interface 420 between the unirradiated region and the melted region. As noted above, the grains grow epitaxially from the solidus boundaries on either side of the melted region. Thus, the laterally growing grains adopt the texture of the pre-crystallized film, formed as described above. By selecting the laser pulse width so that the molten zone width is less than about two times the characteristic LGL, the grains growing from both solid/melt interfaces collide with one another approximately at the center of the melted region, e.g., at centerline 405, and the lateral growth stops. The two melt fronts collide approximately at the centerline 405 before the temperature of the melt becomes sufficiently low to trigger nucleation.

Figure 7D:
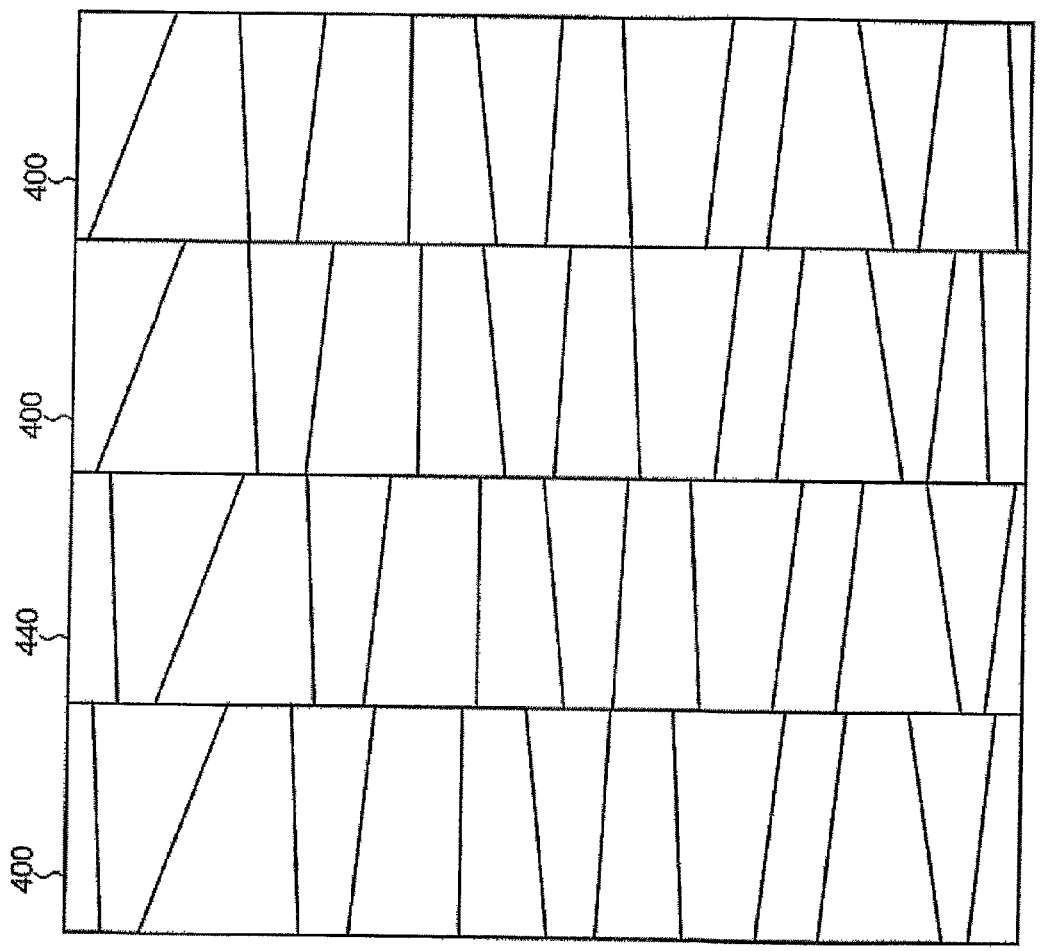

Referring to FIG. 7B, after being displaced by a predetermined distance δ that is at least greater than about LGL and less than at most two LGL, a second region of the substrate 400' is irradiated with a second laser beam pulse. The displacement of the substrate, δ, is related to the desired degree of overlap of the laser beam pulse. As the displacement of the substrate becomes longer, the degree of overlap becomes less. It is advantageous and preferable to have the overlap degree of the laser beam to be less than about 90% and more than about 10% of the LGL. The overlap region is illustrated by brackets 430 and dashed line 435. The film region 400' exposed to the second laser beam irradiation melts completely and crystallizes. In this case, the grains grown by the first irradiation pulse serve as crystallizing seeds for the lateral growth of the grains grown from the second irradiation pulse. FIG. 7C illustrates a region 440 having crystals that are laterally extended beyond a lateral growth length. Thus, a column of elongated crystals are formed by two laser beam irradiations on average. Because two irradiation pulses are all that is required to form the column of laterally extended crystals, the process is also referred to as a "two shot" process. Irradiation continues across the substrate to create multiple columns of laterally extended crystals. FIG. 7D illustrates the microstructure of the substrate after multiple irradiations and depicts several columns 440 of laterally extended crystals.

Thus, in uniform SLS, a film is irradiated and melted with a low number of pulses, e.g., two. The crystals that form within the melted regions preferably grow laterally and with a similar orientation, and meet each other at a boundary within the particular irradiated region of film. The width of the irradiation pattern is preferably selected so that the crystals grow without nucleation. In such instances, the grains are not significantly elongated; however, they are of uniform size and orientation. For further details on variations of uniform SLS processes, see U.S. Pat. No. 6,573,531, the contents of which are incorporated herein in their entirety by reference, and PCT Publication No. WO 2006/107926, entitled "Line Scan Sequential Lateral Solidification of Thin Films," the entire contents of which are incorporated herein by reference. Other lateral crystallization methods that provide relatively short elongations of crystal grains are also suitable, for example so-called "Dot-SLS" methods as described in U.S. Patent Publication number 2006/0102901, as well as controlled super-lateral growth, or "C-SLG" methods, as described in PCT Publication No. WO US03/25947, the entire contents of which are incorporated herein by reference.

Figure 5:
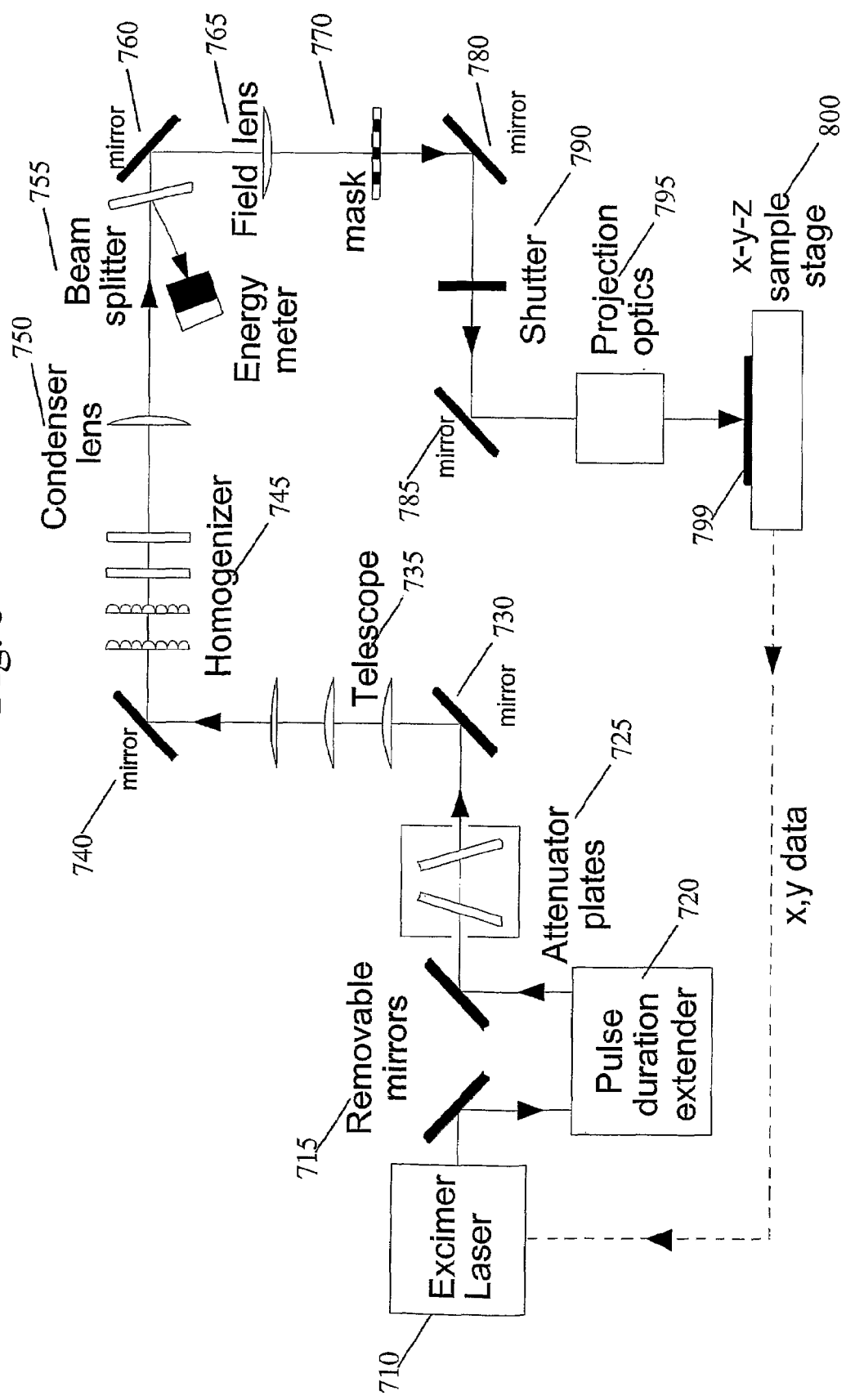
FIG. 5 is a schematic diagram of an apparatus for sequential lateral crystallization of a semiconductor film according to some embodiments.

FIG. 5 illustrates an SLS system according to some embodiments. A light source, for example, an excimer laser 710 generates a laser beam which then passes through a pulse duration extender 720 and attenuator plates 725 prior to passing through optical elements such as mirrors 730, 740, 760, telescope 735, homogenizer 745, beam splitter 755, and lens 765. The laser beam pulses are then passed through a mask 770, which may be on a translation stage (not shown), and projection optics 795. The mask can be a slit, which shapes the laser beam into a "line beam," although the system is capable of making more complex beam shapes depending on the choice of mask. The projection optics reduce the size of the laser beam and simultaneously increase the intensity of the optical energy striking substrate 799 at a desired location. The substrate 799 is provided on a precision x-y-z stage 800 that can accurately position the substrate 799 under the beam and assist in focusing or defocusing the image of the mask 770 produced by the laser beam at the desired location on the substrate. As described in U.S. Patent Publication No. 2006/0102901, the firing of the laser can be coordinated with the motion of x-y-z stage 800 to provide location-controlled firing of pulses.

Although the discussion above refers to the processing of silicon thin films, many other kinds of thin films are compatible. The thin film can be a semiconductor or a conductor, such as a metal. Exemplary metals include aluminum, copper, nickel, titanium, gold, and molybdenum. Exemplary semiconductor films include conventional semiconductor materials, such as silicon, germanium, and silicon-germanium. Additional layers situated beneath or above the metal or semiconductor film are contemplated, for example, silicon oxide, silicon nitride and/or mixtures of oxide, nitride, or other materials that are suitable, for example, for use as a thermal insulator to further protect the substrate from overheating or as a diffusion barrier to prevent diffusion or impurities from the substrate to the film. See, e.g., PCT Publication No. WO 2003/084688, for methods and systems for providing an aluminum thin film with a controlled crystal orientation using pulsed laser induced melting and nucleation-initiated crystallization.

In view of the wide variety of embodiments to which the principles of the present invention can be applied, it should be understood that the illustrated embodiments are illustrative only, and should not be taken as limiting the scope of the present invention.

What is claimed is:

1. A system for pre-crystallizing regions of a film, the system comprising:
    a laser source providing a laser beam having a fluence that is selected to form a mixture of solid and liquid in the film and where a fraction of the film is molten throughout its thickness in an irradiated region;
    a movable at least partially reflective optical element in the path of the laser beam capable of controllably redirecting the path of the laser beam;
    a stage for supporting the film and capable of translation in at least a first direction; and
    memory for storing a set of instructions, the instructions comprising:
    (a) defining a plurality of spaced-apart regions to be pre-crystallized within the film, the film being disposed on a substrate and capable of laser-induced melting;
    (b) positioning the film relative to the laser beam in preparation for at least partially pre-crystallizing a first region of said plurality of spaced-apart regions;
    (c) moving the movable optical element so as to scan and irradiate a first portion of the first region with the beam in the first direction at a first velocity, wherein the first velocity is selected such that the beam forms a mixture of solid and liquid in the irradiated first portion of the film and where a fraction of the film is molten throughout its thickness in the first portion of the first region, wherein said first portion of the first region upon cooling forms crystalline grains having predominantly the same crystallographic orientation in at least a single direction;
    (d) after moving the movable optical element so as to scan the first portion of the first region, translating the film relative to the laser beam in a second direction so as to scan a second portion of the first region with the laser beam in the first direction at the first velocity, wherein the second portion of the first region upon cooling forms crystalline grains having predominantly the same crystallographic orientation in said at least a single direction.

2. The system of claim 1, wherein the laser beam is continuous-wave.

3. The system of claim 1, further comprising re-positioning the film relative to the laser beam in preparation for at least partially re-crystallizing a second region of the plurality of spaced-apart regions; and moving the movable optical element so as to scan a first portion of the second region with the beam in the first direction at the first velocity, wherein the first portion of the second region upon cooling forms crystalline grains having predominantly the same crystallographic orientation in said at least a single direction.

4. The system of claim 1, wherein the first velocity is further selected such that heat generated by the beam substantially does not damage the substrate.

5. The system of claim 1, wherein the movable optical element comprises a disk comprising a plurality of facets that at least partially reflect said laser beam onto the film.

6. The system of claim 1, wherein the first velocity is at least about 0.5 m/s.

7. The system of claim 1, wherein the first velocity is at least about 1 m/s.

8. The system of claim 1, wherein the memory further includes instructions to partially overlap the first and second portions of the first region.

9. The system of claim 8, wherein the memory further includes instructions to continuously translate the film in the second direction with a second velocity selected to provide a pre-determined amount of overlap between the first and second portions of the first region.

10. The system of claim 1, wherein the memory further includes instructions to continuously translate the film in the second direction with the second velocity for a period of time selected to sequentially irradiate and partially melt a plurality of portions of the first region, wherein each of said plurality of portions upon cooling forms crystalline grains having predominantly the same crystallographic orientation in said at least a single direction.

11. The system of claim 1, wherein the memory further includes instructions to perform uniform sequential lateral crystallization in at least the first region.

12. The system of claim 1, wherein the memory further includes instructions for defining a width for each spaced-apart region that is at least as large as a device of circuit intended to be later fabricated in that region.

13. The system of claim 1, wherein the memory further includes instructions for defining a width for each spaced-apart region that is at least as large as a width of a thin film transistor intended to be later fabricated in that region.

14. The system of claim 1, wherein the film comprises at least one of a conductor and a semiconductor.

15. The system of claim 1, wherein the film comprises silicon.

16. The system of claim 1, wherein the substrate comprises glass.

17. The system of claim 1, further comprising laser optics to shape said laser beam.

* * * * *

UNITED STATES PATENT AND TRADEMARK OFFICE
CERTIFICATE OF CORRECTION

PATENT NO.       : 8,598,588 B2                                          Page 1 of 1
APPLICATION NO. : 12/095450
DATED            : December 3, 2013
INVENTOR(S)      : James S. Im It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1295 days.

Signed and Sealed this

Twenty-second Day of September, 2015

Michelle K. Lee
*Director of the United States Patent and Trademark Office*